United States Patent
Yagawa et al.

(10) Patent No.: US 12,091,063 B2
(45) Date of Patent: Sep. 17, 2024

(54) DAMPING DEVICE, STACKER CRANE, TRANSPORT SYSTEM, AND DAMPING DEVICE JIG

(71) Applicant: Murata Machinery, Ltd., Kyoto (JP)

(72) Inventors: Kazuma Yagawa, Ise (JP); Ken Inada, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 389 days.

(21) Appl. No.: 17/604,697

(22) PCT Filed: Feb. 3, 2020

(86) PCT No.: PCT/JP2020/003979
§ 371 (c)(1),
(2) Date: Oct. 18, 2021

(87) PCT Pub. No.: WO2020/217632
PCT Pub. Date: Oct. 29, 2020

(65) Prior Publication Data
US 2022/0177014 A1    Jun. 9, 2022

(30) Foreign Application Priority Data

Apr. 24, 2019   (JP) ................. 2019-082984

(51) Int. Cl.
*B61G 11/04* (2006.01)
*B66F 9/07* (2006.01)
*B66F 9/075* (2006.01)

(52) U.S. Cl.
CPC ............ *B61G 11/04* (2013.01); *B66F 9/07* (2013.01); *B66F 9/07513* (2013.01)

(58) Field of Classification Search
CPC .. F16F 7/00; H01L 21/6773; H01L 21/67769; B61G 11/04; B61G 1/04;
(Continued)

(56) References Cited

U.S. PATENT DOCUMENTS 6,553,617 B1 *   4/2003   Salice .................. F16F 9/3235
                                                      16/85
2004/0201154 A1   10/2004  Salice
(Continued)

FOREIGN PATENT DOCUMENTS

CN      2711460 Y      7/2005
CN      101680200 A    3/2010
(Continued)

OTHER PUBLICATIONS

Office Action dated Mar. 17, 2023, of counterpart Taiwanese Patent Application No. 109113582, along with an English machine translation.
(Continued)

*Primary Examiner* — Robert A. Siconolfi
*Assistant Examiner* — San M Aung
(74) *Attorney, Agent, or Firm* — DLA Piper LLP (US)

(57) ABSTRACT

A damping device includes a damper provided to an outer end of a stacker crane in a traveling direction. The damper includes: a rod member extending along the traveling direction; a first biasing member configured to bias the rod member outward in the traveling direction; and a movement restriction mechanism configured to allow inward movement of the rod member in the traveling direction and restrict outward movement of the rod member in the traveling direction when the rod member has moved inward in the traveling direction.

9 Claims, 23 Drawing Sheets

(58) Field of Classification Search
CPC ...... B66F 9/07; B66F 9/07513; E01F 15/146; E05F 5/006; E05F 5/02; E05Y 2201/21; E05Y 2201/254; E05Y 2201/256; E05Y 2201/266; E05Y 2201/696; E05Y 2600/45; E05Y 2600/46; E05Y 2900/20
USPC .......................................................... 267/4
See application file for complete search history.

(56) References Cited

U.S. PATENT DOCUMENTS

2010/0080652 A1\* 4/2010 Shin ...................... E01F 15/146
404/6
2011/0283478 A1\* 11/2011 Berry ........................ E05F 5/02
16/68

FOREIGN PATENT DOCUMENTS

| CN | 103821864 A | | 5/2014 | |
|---|---|---|---|---|
| JP | 62-451 U | | 1/1987 | |
| JP | H02-209639 A | | 8/1990 | |
| JP | 7-10216 A | | 1/1995 | |
| JP | 2007-1692 A | | 1/2007 | |
| JP | 2015-034087 A | | 2/2015 | |
| SU | 1184988 A | \* | 10/1985 | ............... F16F 7/00 |
| TW | 201811645 A | | 4/2018 | |

OTHER PUBLICATIONS

International Preliminary Report on Patentability dated Nov. 4, 2021, of counterpart International Application No. PCT/JP2020/003979.

\* cited by examiner

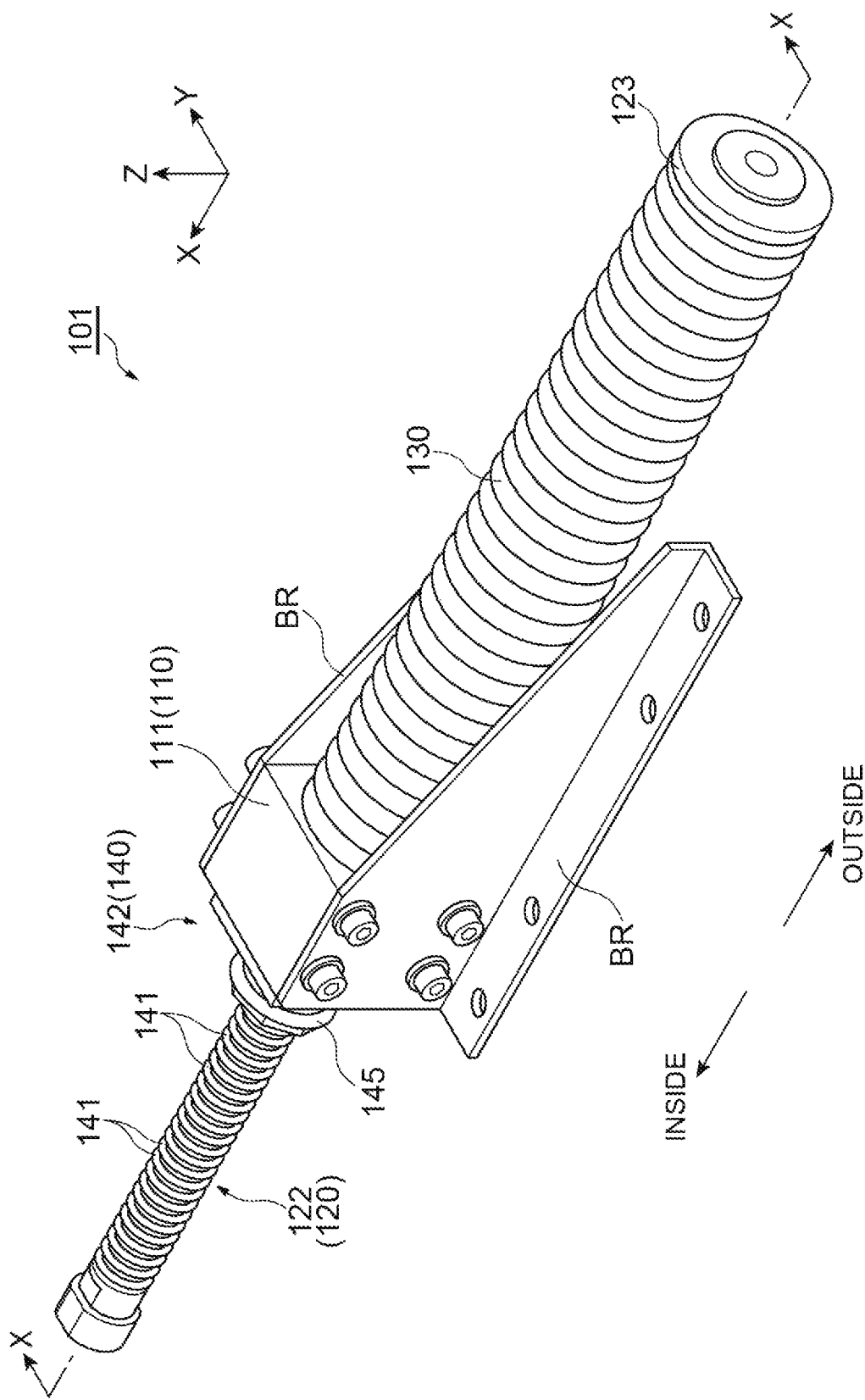

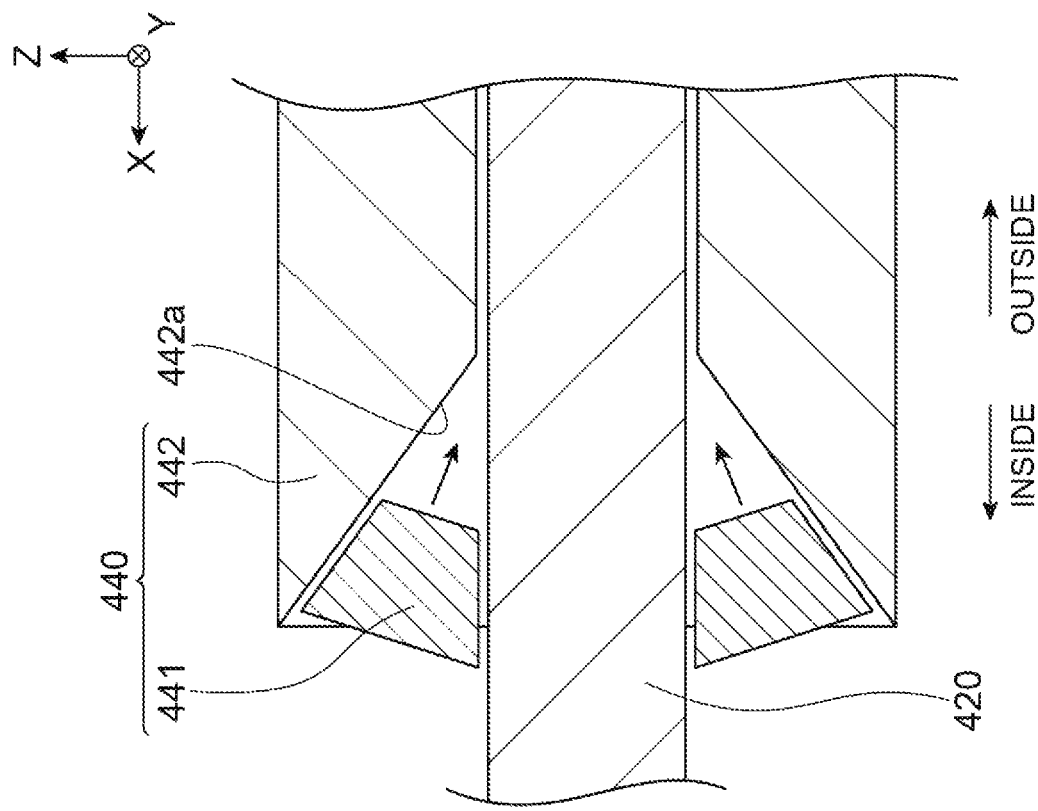
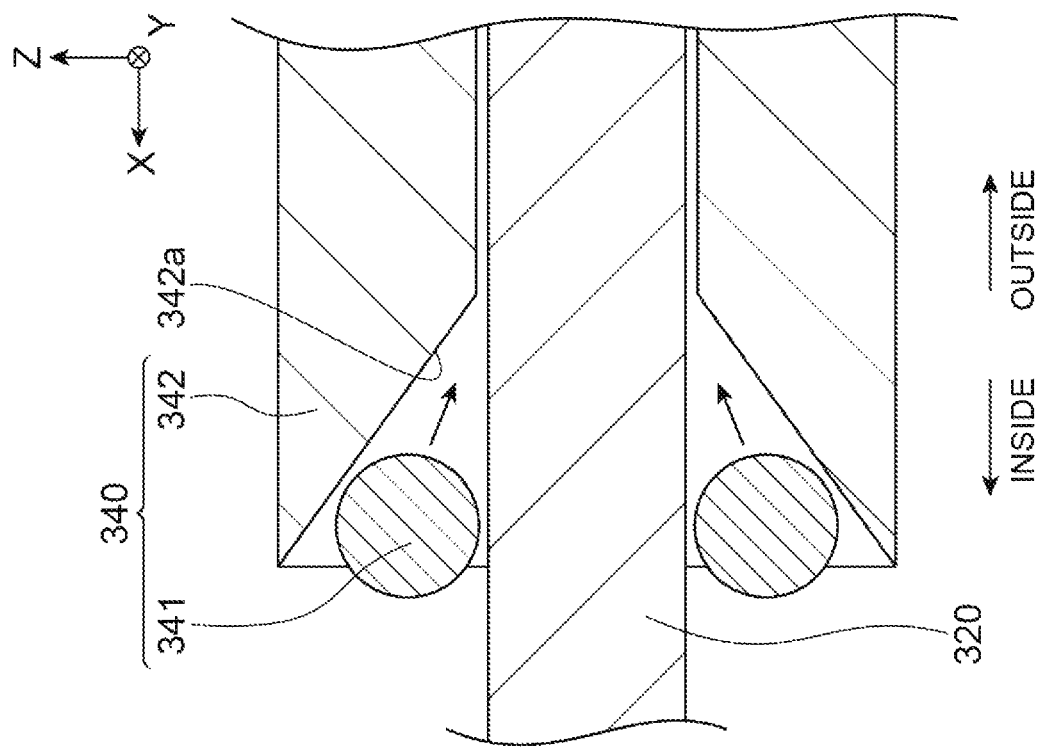

DAMPING DEVICE, STACKER CRANE, TRANSPORT SYSTEM, AND DAMPING DEVICE JIG

TECHNICAL FIELD

This disclosure relates to a damping device, a stacker crane, a transport system, and a damping device jig.

BACKGROUND

A damping device including a damper provided to an outer end of a stacker crane in a traveling direction is known. For example, Japanese Unexamined Patent Publication No. 2007-1692 describes a stacker crane including a vehicle configured to travel on a traveling path and mechanical dampers (dampers) provided to the front end and the rear end of the vehicle.

In the above-described technique, when the traveling stacker crane has collided, an impact force of the collision is intended to be alleviated by the action of the damper. However, the stacker crane is pushed back by the action of the damper (bounces back toward the side opposite to the traveling direction), which may increase the possibility of breakage of equipment, for example.

In view of this, it could be helpful to provide a damping device configured to, when a stacker crane has collided, alleviate an impact force of the collision and prevent the stacker crane from being pushed back, a stacker crane including the damping device, a transport system including the stacker crane, and a damping device jig to be used for the damping device.

SUMMARY

A damping device includes a damper provided to an outer end of a stacker crane in a traveling direction. The damper includes: a rod member extending along the traveling direction; a first biasing member configured to bias the rod member outward in the traveling direction; and a movement restriction mechanism configured to allow inward movement of the rod member in the traveling direction and restrict outward movement of the rod member in the traveling direction when the rod member has moved inward in the traveling direction.

In the damping device, when the stacker crane has collided, the rod member comes into contact with a collision opponent, thereby being pressed inward in the traveling direction. At this time, because the rod member is biased outward in the traveling direction by the first biasing member, the rod member moves inward in the traveling direction while absorbing the impact force of the collision. The rod member that has moved inward in the traveling direction is prevented from returning (moving) outward in the traveling direction to its initial position by restriction of the movement restriction mechanism. Thus, the stacker crane is prevented from being pushed back due to returning of the rod member. Thus, with this damping device, when the stacker crane has collided, the impact force of the collision can be alleviated, and also the stacker crane can be prevented from being pushed back.

The movement restriction mechanism may include: a plurality of engaged portions aligned along the traveling direction, the engaged portions each being a protrusion formed on an outer peripheral surface of the rod member, and each having an inner side surface in the traveling direction that is inclined with respect to the traveling direction and an outer side surface in the traveling direction that is orthogonal to the traveling direction; and an engaging portion having elasticity along a direction of approaching the outer peripheral surface of the rod member and configured to engage with the outer side surface of each engaged portion in the traveling direction. With this configuration, the above-described effects of alleviating the impact force and also preventing the stacker crane from being pushed back when the stacker crane has collided can be effectively obtained.

The engaging portion may include: a tubular member provided to surround the outer peripheral surface of the rod member and split into at least two when viewed from the traveling direction; a claw formed on an inner peripheral surface of the tubular member and configured to contact the engaged portion; and a second biasing member configured to bias the tubular member toward the rod member. With this configuration, it is possible to reliably engage the engaging portion with the engaged portion while facilitating attachment of the engaging portion.

An inner side, in the traveling direction, of an inner peripheral surface of the tubular member may have an inclined surface that is inclined to become wider toward inside in the traveling direction. In this configuration, by pressing a jig against the inclined surface along the axial direction of the tubular member, the tubular member can be deformed to be opened, whereby engagement of the engaging portion with the engaged portion can be released.

A stacker crane includes the above-described damping device, and the damper is provided at least two on outer ends of the stacker crane in the traveling direction.

The above-described functional effects can be obtained because it includes the above-described damping device. Furthermore, because the damper is provided at least two, impact force of collision can be distributed to be alleviated when the stacker crane has collided. A moment generated in the stacker crane due to the impact force can also be alleviated.

The stacker crane may include, as the damper, a first damper, a second damper, a third damper, and a fourth damper. The first damper may be provided on an upper side in a vertical direction and on one side in a width direction intersecting the traveling direction and the vertical direction. The second damper may be provided on the upper side in the vertical direction and on the other side in the width direction. The third damper may be provided on a lower side in the vertical direction and on the one side in the width direction. The fourth damper may be provided on the lower side in the vertical direction and on the other side in the width direction. With this configuration, the first to fourth dampers cooperatively operate, thereby being able to further distribute impact force of collision when the stacker crane has collided. The moment generated in the stacker crane due to this impact force can also be further alleviated. The rigidity of the stacker crane (a mast in particular) can be effectively reduced, whereby the configuration of the stacker crane can be simplified.

A transport system includes the above-described stacker crane, and includes, as the stacker crane, a first stacker crane and a second stacker crane. The first stacker crane includes the damper on its outer end in the traveling direction on a side closer to the second stacker crane. The second stacker crane includes the damper on its outer end in the traveling direction on a side closer to the first stacker crane. The damper of the first stacker crane and the damper of the second stacker crane are disposed at positions where the dampers are capable of coming into contact with each other.

In this transport system, the dampers are provided on the side of the first stacker crane closer to the second stacker crane and the side of the second stacker crane closer to the first stacker crane. With this configuration, when the first stacker crane and the second stacker crane have collided with each other, the damper of the first stacker crane and the damper of the second stacker crane come into contact with each other, thereby being able to alleviate the impact force.

A damping device jig is a jig to be used for the above-described damping device and configured to release engagement of the engaging portion with the engaged portion, and includes a jig body in which a hole, through which the rod member is insertable, is formed. The jig body has a contact portion configured to contact the engaging portion such that the engaging portion elastically deforms in a direction of being separated from the rod member.

With this damping device jig, the rod member is inserted through the hole of the jig body, and the contact portion of the jig body is brought into contact with the engaging portion, whereby the engaging portion can be elastically deformed in the direction of being separated from the rod member. Thus, the engaging portion can be separated from the outer side surface of the engaged portion in the traveling direction, whereby engagement of the engaging portion with the engaged portion can be released (hereinafter "engagement release"). In other words, with this damping device jig, engagement can be easily released in the above-described damping device.

The damping device jig may include an elastic-deformation restriction member detachably fixed to the damper and configured to contact or be adjacent to a side of the engaging portion opposite to a rod member side. With this configuration, the engaging portion can be prevented from elastically deforming unintentionally in the direction of being separated from the rod member, and the engagement can be prevented from being released unintentionally.

The damping device jig may include an adjuster detachably fixed to the rod member and configured to adjust the amount of movement when the rod member is biased to be moved outward in the traveling direction by the first biasing member after engagement of the engaging portion with the engaged portion has been released. With this configuration, the rod member can be prevented from returning to the initial position immediately after the engagement has been released.

In the damping device jig, the adjuster may include: a shaft extending along the traveling direction, having one end detachably fixed to an inside on the rod member in the traveling direction, and having an external thread on its outer peripheral surface; a thread-engaging member thread-engaging with the external thread of the shaft; and a support member fixed to the jig body and being in contact with an outside on the thread-engaging member in the traveling direction. With this configuration, engagement release and adjustment of the amount of movement by the adjuster can be performed as follows. Specifically, by rotating the shaft in one direction, the thread-engaging member is tightened outward in the traveling direction, and the jig body is pressed outward in the traveling direction to be moved with the support member interposed therebetween. The contact portion of the jig body is brought into contact with the engaging portion, the engaging portion is elastically deformed in the direction of being separated from the rod member, the engagement is released, and then this movement of the jig body is stopped. In this state, by rotating the shaft in the other direction, the rod member is moved outward in the traveling direction toward the initial position by the amount of movement corresponding to this rotation.

In the damping device jig, the jig body may include a first member to which the contact portion is provided and a second member to which the support member is fixed and also the first member is detachably fixed. In this configuration, after the engagement has been released, by removing the first member from the second member, the engaging portion can be easily engaged with the engaged portion again.

Thus, when a stacker crane has collided, impact force of the collision can be alleviated and also the stacker crane can be prevented from being pushed back.

BRIEF DESCRIPTION OF THE DRAWINGS

FIG. 9 is a perspective view of the damper in FIG. 4 after the collision.

FIG. 23(a) is a sectional view illustrating a lock mechanism and a rod member according to a modification.

FIG. 23(b) is a sectional view illustrating a lock mechanism and a rod member according to another modification.

REFERENCE SIGNS LIST

1 . . . transport system, 7 . . . stacker crane, 7A . . . first stacker crane (stacker crane), 7B . . . second stacker crane (stacker crane), 100 . . . damping device, 101 . . . damper, 101A . . . first damper (damper), 101B . . . second damper (damper), 101C . . . third damper (damper), 101D . . . fourth damper (damper), 120, 320, 420 . . . rod member, 130 . . . first biasing member, 140, 340, 440 . . . lock mechanism (movement restriction mechanism), 141 . . . engaged portion, 141a . . . side surface on inside, 141b . . . side surface on outside, 142 . . . engaging portion, 143 . . . tubular member, 144 . . . claw, 145 . . . second biasing member, 148 . . . inclined surface, 200 . . . damping device jig, 210 . . . jig body, 210x . . . hole, 211 . . . first member, 212 . . . second member, 215 . . . contact portion, 220 . . . safety cover (elastic-deformation restriction member), 230 . . . adjuster, 231 . . . shaft, 231a . . . external thread, 232 . . . thread-engaging member, 233 . . . support member, 341 . . . steel ball (movement restriction mechanism), 342, 442 . . . cylindrical member (movement restriction mechanism), 441 . . . collar (movement restriction mechanism)

DETAILED DESCRIPTION

One example will now be described in detail with reference to the drawings. In the description of the drawings, like elements are designated by like reference signs, and duplicate description is omitted.

Figure 1:
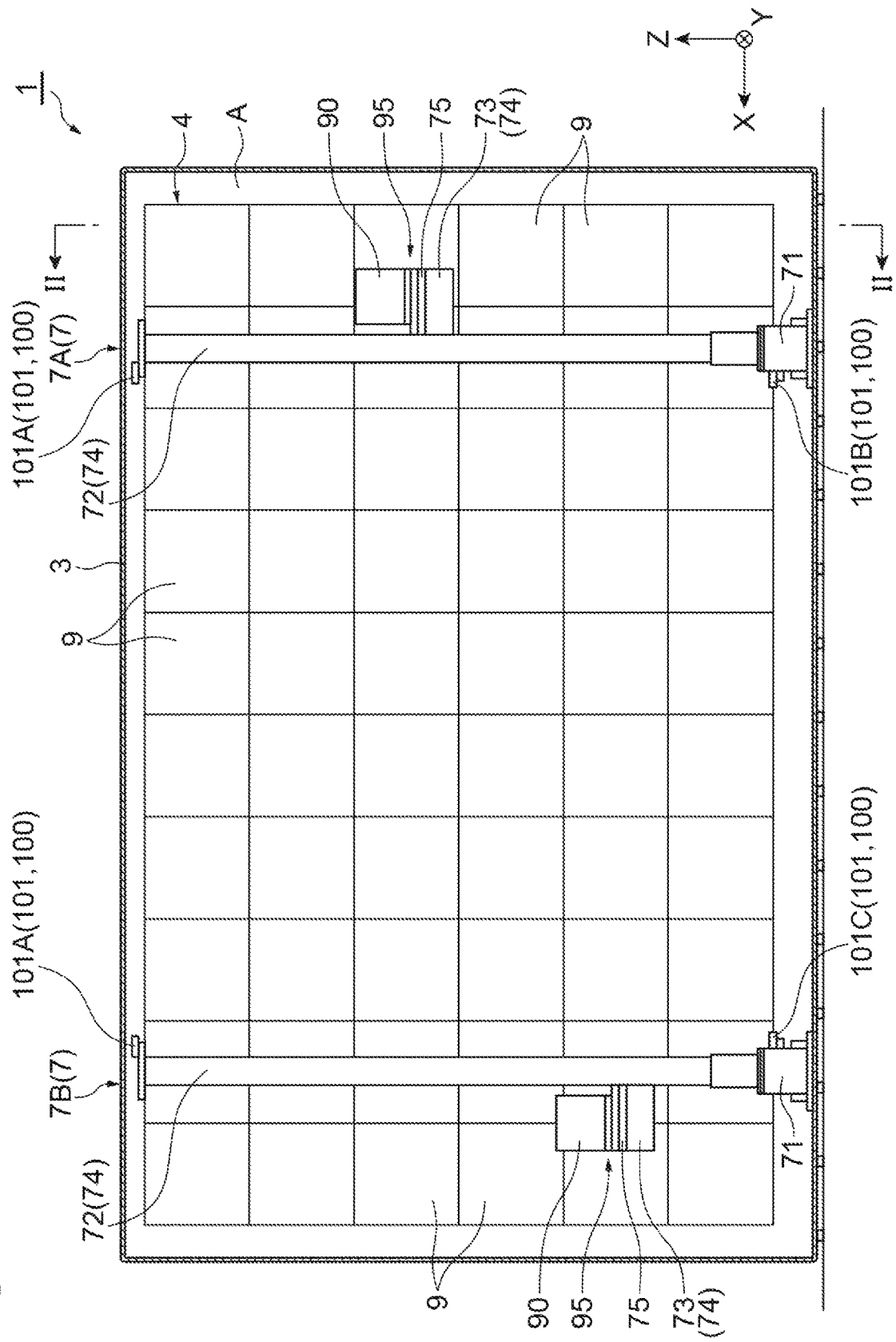
FIG. 1 is a sectional view illustrating a schematic configuration of a transport system including stacker cranes according to one example.
Figure 2:
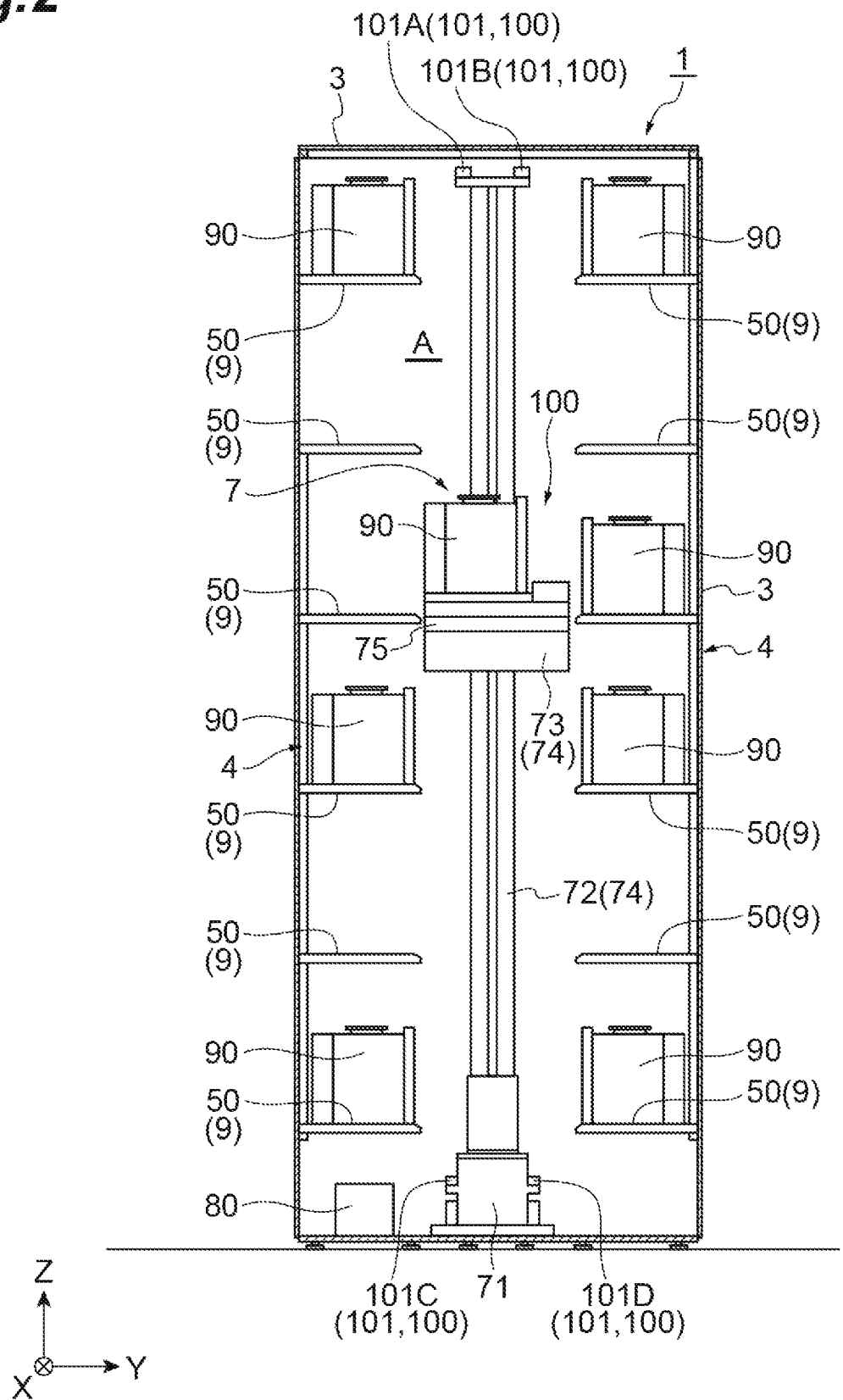
FIG. 2 is a sectional view taken along line II-II in FIG. 1.

A transport system including a stacker crane according to the example will be described. As illustrated in FIGS. 1 and 2, this transport system 1 mainly includes a body 3, racks 4, a plurality of stacker cranes 7, and a controller 80. The transport system 1 is provided in a clean room, for example. The transport system 1 serves as a stocker configured to store storage containers (conveyed objects) 90 such as front opening unified pods (FOUPs) in which objects to be stored such as semiconductor wafers and glass substrates are stored.

The body 3 is a section that defines an internal space A of the transport system 1, and is formed with a plurality of partitions. The racks 4 are sections in which storage containers 90 are placed, and are commonly provided in one to two rows (herein, two rows). Each rack 4 extends in an X direction (width direction), and adjacent two racks 4, 4 are disposed substantially parallel to be opposed to each other. Each rack 4 includes a storage section 9 formed of a storage shelf 50 on which a storage container 90 is placed to be stored. The storage shelves 50 are arranged along the X direction and a Z direction (vertical direction).

Each stacker crane 7 is a mechanism configured to bring a storage container 90 onto and out from a storage shelf 50 and also move a storage container 90 between storage shelves 50. The stacker crane 7 is disposed in an area sandwiched between the opposed racks 4, 4. The stacker crane 7 travels on a track (not illustrated) installed on a floor along a direction (X direction) in which the rack 4 extends, thereby being able to move along the rack 4 in the X direction. The transport system 1 of this example includes, as the stacker cranes 7, a first stacker crane 7A and a second stacker crane 7B.

Each stacker crane 7 includes a traveling unit 71, a lifting unit 74, a turning unit 75, a transfer device 95, and a damping device 100. The traveling unit 71 is provided to be able to travel on the track in the X direction by a traveling drive unit such as a motor. The lifting unit 74 raises and lowers the transfer device 95. The lifting unit 74 includes a support post 72 and a platform 73. The support post 72 is a member provided above the traveling unit 71 and extending in the vertical direction. On the platform 73, the transfer device 95 is mounted with the turning unit 75 interposed therebetween. The platform 73 is provided to be able to be raised or lowered along the support post 72 by a lifting drive unit such as a motor.

The turning unit 75 turns the transfer device 95. On the turning unit 75, the transfer device 95 is mounted. The turning unit 75 rotates the transfer device 95 in a rotational direction about an axis along the Z direction. Configurations, mechanisms, or arrangements of the traveling unit 71, the lifting unit 74, and the turning unit 75 are not limited to particular ones. As the traveling unit 71, the lifting unit 74, and the turning unit 75, known various mechanisms or devices may be used.

The controller 80 as shown in FIG. 1 controls the respective units in the stacker cranes 7. The controller 80 is disposed inside the body 3, for example. The controller 80 includes a central processing unit (CPU), a random access memory (RAM), and a read only memory (ROM). In the controller 80, hardware such as the CPU, the RAM, and the ROM and software cooperatively operate, thereby performing various controls.

The damping device 100 includes a damper 101 provided to an outer end of each stacker crane 7 in the X direction (traveling direction). When the stacker crane 7 collides in the X direction (hereinafter "collision time"), the damper 101 alleviates impact force thereof. The first stacker crane 7A has the damper 101 on an end thereof closer to the second stacker crane 7B in the X direction. The second stacker crane 7B has the damper 101 on an end thereof closer to the first stacker crane 7A in the X direction. The damper 101 is provided at least two (herein, four) to outer ends of each stacker crane 7 in the X-direction. Specifically, the damping device 100 includes, as the damper 101, a first damper 101A, a second damper 101B, a third damper 101C, and a fourth damper 101D.

The first damper 101A is provided to each stacker crane 7 on an upper side in the Z direction and one side in a Y direction (a width direction intersecting the traveling direction and the vertical direction). The second damper 101B is provided to the stacker crane 7 on the upper side in the Z direction and the other side in the Y direction. In the illustrated example, the first damper 101A and the second damper 101B are provided to an upper portion of the corresponding support post 72. The third damper 101C is provided to the stacker crane 7 on a lower side in the Z direction and the one side in the Y direction. The fourth damper 101D is provided to the stacker crane 7 on the lower side in the Z direction and the other side in the Y direction. In the illustrated example, the third damper 101C and the fourth damper 101D are provided to the corresponding traveling unit 71.

Figure 3:
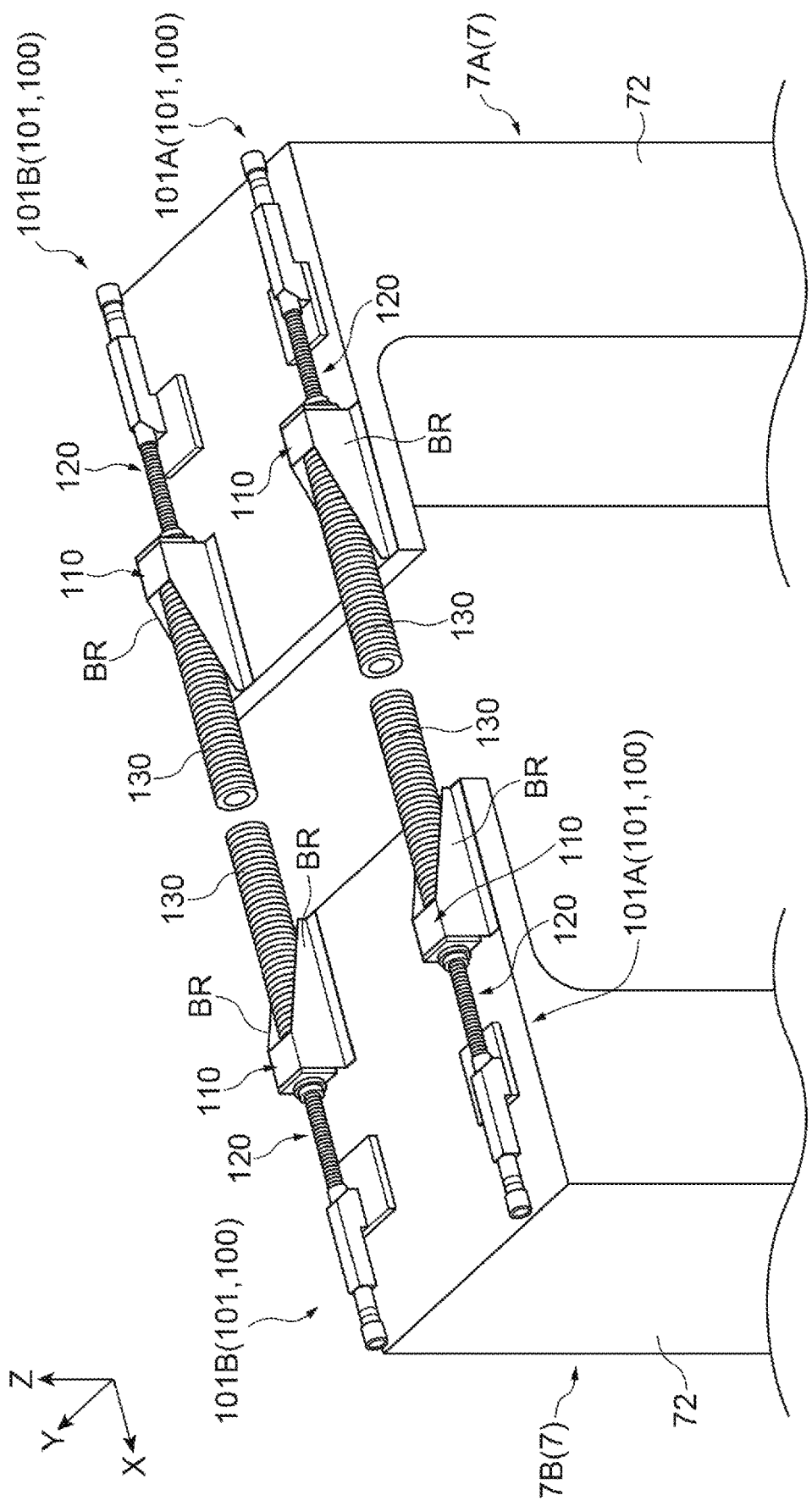
FIG. 3 is a perspective view illustrating the stacker crane and damping devices in FIG. 1.

As illustrated in FIGS. 1 to 3, the damper 101 provided to the first stacker crane 7A and the damper 101 provided to the second stacker crane 7B are opposed to each other. The first damper 101A provided to the first stacker crane 7A and the first damper 101A provided to the second stacker crane 7B are arranged to contact (in positions where they can come into contact) each other at a collision time. The second damper 101B provided to the first stacker crane 7A and the second damper 101B provided to the second stacker crane 7B are arranged to contact (in positions where they can come into contact) each other at the collision time. The third damper 101C provided to the first stacker crane 7A and the third damper 101C provided to the second stacker crane 7B are arranged to contact (in positions where they can come into contact) each other at the collision time. The fourth damper 101D provided to the first stacker crane 7A and the fourth damper 101D provided to the second stacker crane 7B are arranged to contact (in positions where they can come into contact) each other at the collision time. The first to fourth dampers 101A to 101D provided to the first stacker crane 7A and the first to fourth dampers 101A to 101D provided to the second stacker crane 7B are arranged in a positional relation such that they respectively contact each other at the same timing at the collision time.

The following describes the damper 101 of each damping device 100 in detail.

In the following description, the first damper 101A of the second stacker crane 7B will be described as an example for the damper 101, and description of the other dampers 101 is omitted because they have the same configuration. The outside of each stacker crane 7 in the X direction is referred to as the X-direction outside, and the inside of the stacker crane 7 in the X direction is referred to as the X-direction inside.

Figure 4:
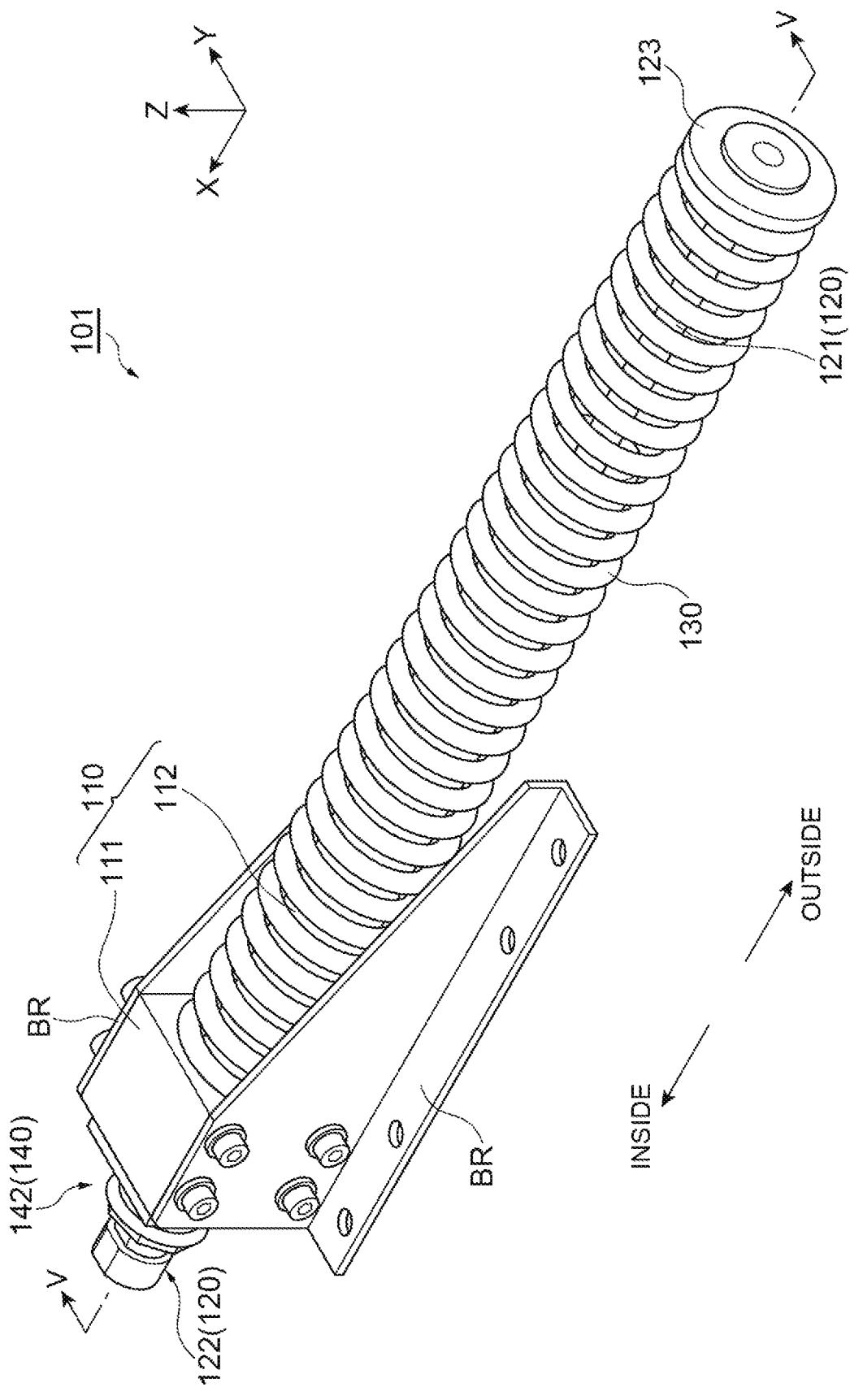
FIG. 4 is a perspective view illustrating a damper of each damping device in FIG. 1.
Figure 5:
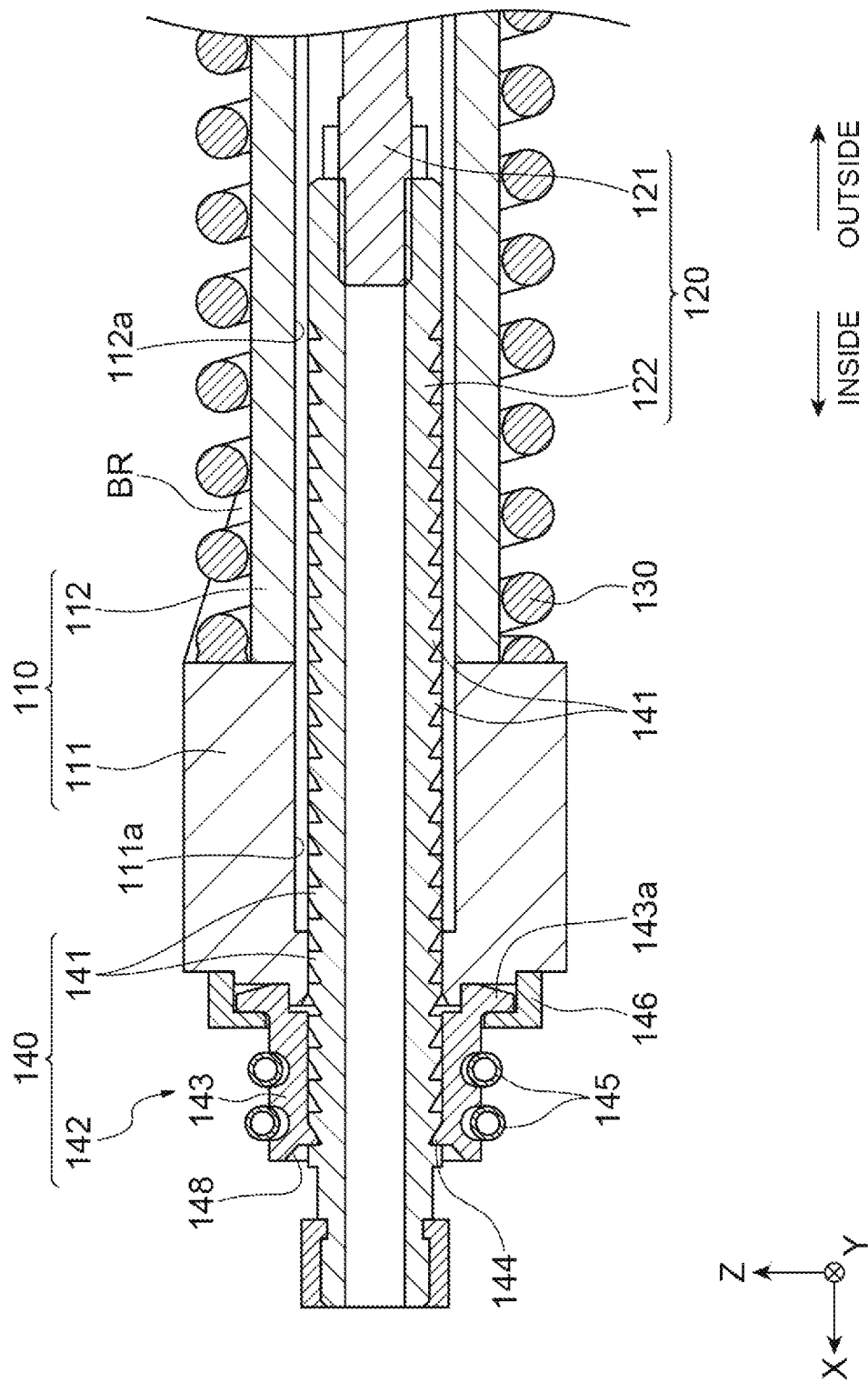
FIG. 5 is a sectional view taken along line V-V in FIG. 4.
Figure 6:
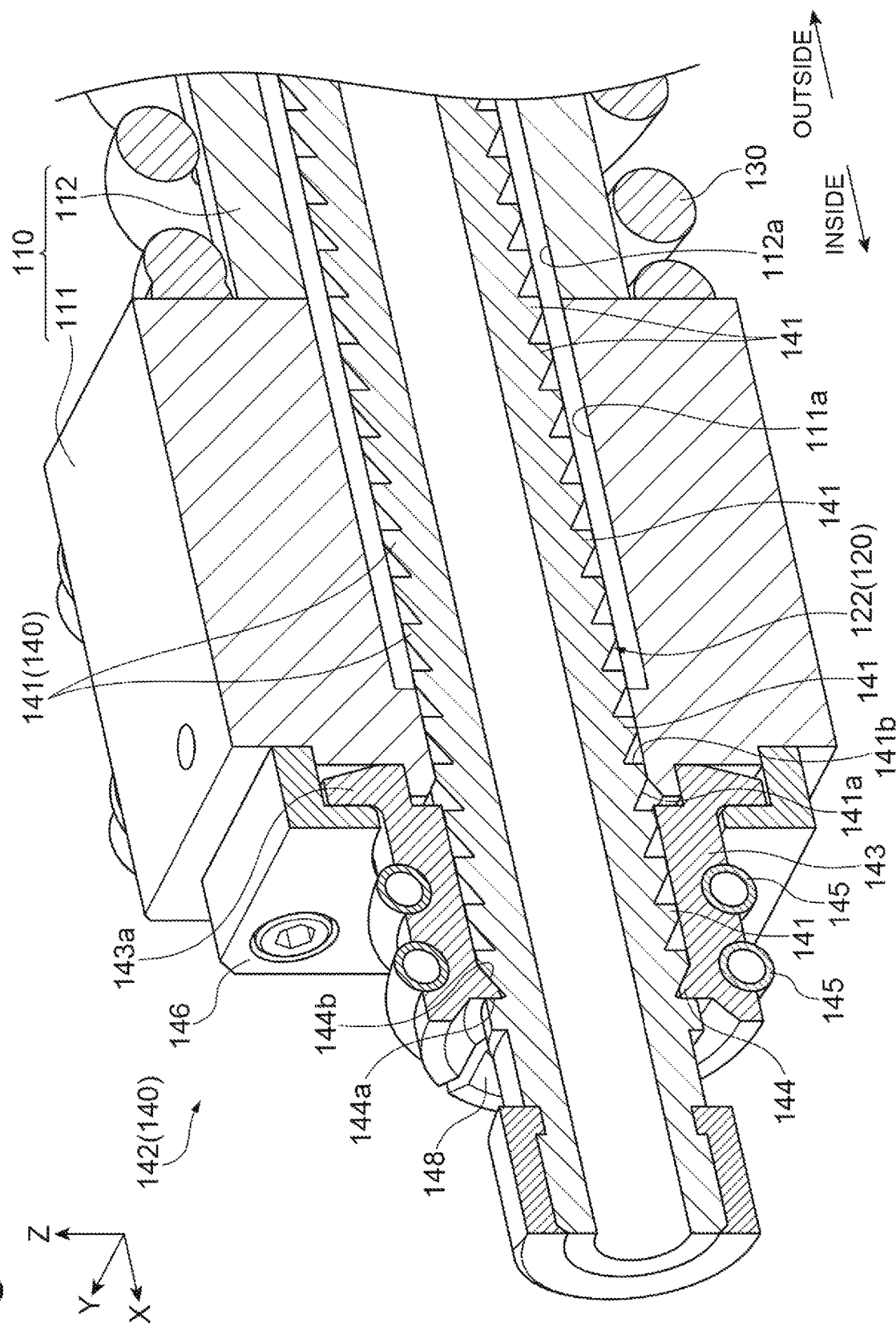
FIG. 6 is a sectional perspective view illustrating part of FIG. 5 in an enlarged manner.

As illustrated in FIGS. 4 to 6, the damper 101 includes a base 110, a rod member 120, a first biasing member 130, and a lock mechanism (movement restriction mechanism) 140. The base 110 includes a block 111 and a base tube 112. The block 111 has a rectangular parallelepiped shape, in which a through hole 111a extending in the X direction is formed. The block 111 is fixed to the stacker crane 7 with brackets BR interposed therebetween as shown in FIG. 3. The base tube 112 has a tubular shape the axial direction of which corresponds to the X direction, and a tubular hole 112a thereof is formed on a surface of the block 111 on the X-direction outside to communicate with the through hole 111a.

The rod member 120 extends along the X direction. The rod member 120 includes a rod portion 121, a tube 122, and a tip piece 123. The rod portion 121 has a round bar shape. The tube 122 has a cylindrical shape. An end of the rod portion 121 on the X-direction inside is inserted into the tube 122 to be fitted (fixed). The tip piece 123 has a disk shape the outside diameter of which is larger than the outside diameter of the rod portion 121. A part of the tip piece 123 on the X-direction outside is formed with a member having elasticity such as rubber. The tip piece 123 is coaxially fixed to an end of the rod portion 121 on the X-direction outside. The rod portion 121 and the tube 122 of the rod member 120 thus configured are inserted into the through hole 111a and the tubular hole 112a of the base 110. The rod member 120 is configured to be movable in the X direction with respect to the base 110.

The first biasing member 130 is a coil spring, for example. The first biasing member 130 is provided to surround the base tube 112 and the rod portion 121. The outside diameter of the first biasing member 130 is smaller than the outside diameter of the tip piece 123. The first biasing member 130 is provided between the block 111 and the tip piece 123 in a compressed state (state of being pressurized in advance). An end of the first biasing member 130 on the X-direction inside is in contact with the block 111. An end of the first biasing member 130 on the X-direction outside is in contact with the tip piece 123. With this configuration, the first biasing member 130 biases the rod member 120 toward the X-direction outside. To be in contact means to hit and touch.

The lock mechanism 140 is a mechanism configured to allow the rod member 120 to move toward the X-direction inside, and also restrict movement of the rod member 120 toward the X-direction outside when the rod member 120 has moved toward the X-direction inside. The lock mechanism 140 includes an engaged portion 141 and an engaging portion 142. In the lock mechanism 140, the engaging portion 142 engages with the engaged portion 141 only toward the X-direction outside, whereby movement of the rod member 120 toward the X-direction outside is restricted and movement thereof toward the X-direction inside is allowed. To engage means to mesh with each other to be stopped.

The engaged portion 141 is an annular protrusion formed on the outer peripheral surface of the tube 122 of the rod member 120. The engaged portion 141 is formed in plurality to be aligned in the X direction. The engaged portions 141 protrude from the outer peripheral surface of the tube 122 in the shape of saw-like teeth. A side surface 141a of each engaged portion 141 on the X-direction inside is inclined with respect to the X direction. A side surface 141b of the engaged portion 141 on the X-direction outside is orthogonal to the X traveling direction. The engaged portions 141 correspond to teeth of a ratchet on one side. The side surfaces 141a and the side surfaces 141b are alternately arranged in the X direction.

Figure 7A:
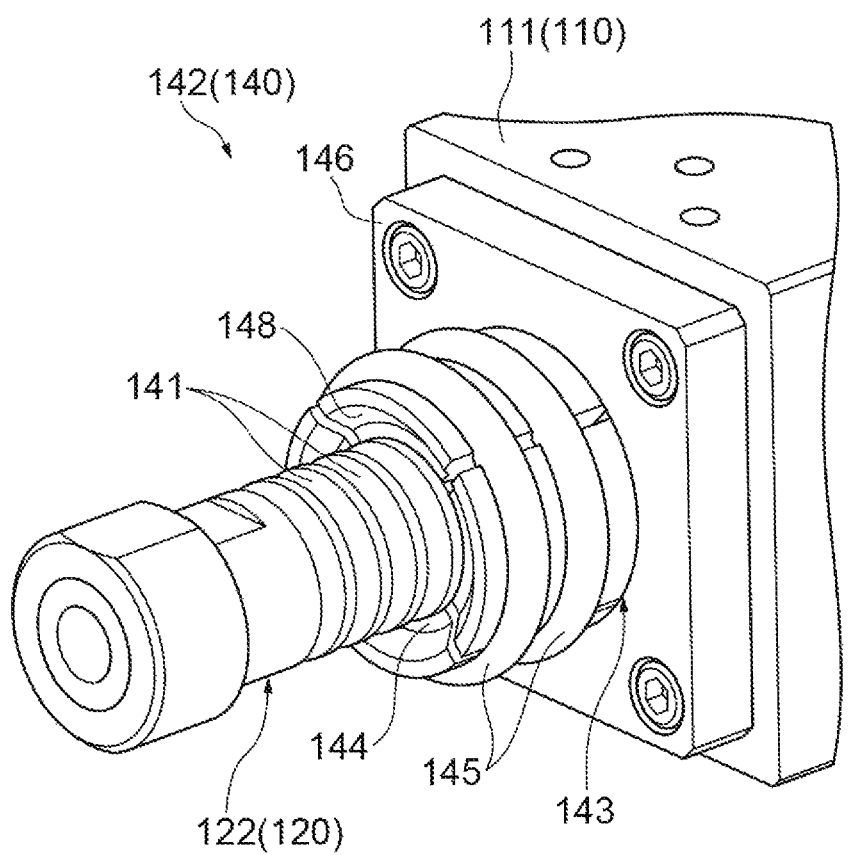
FIG. 7(a) is a perspective view illustrating an engaging portion of the damper in FIG. 4.
Figure 7B:
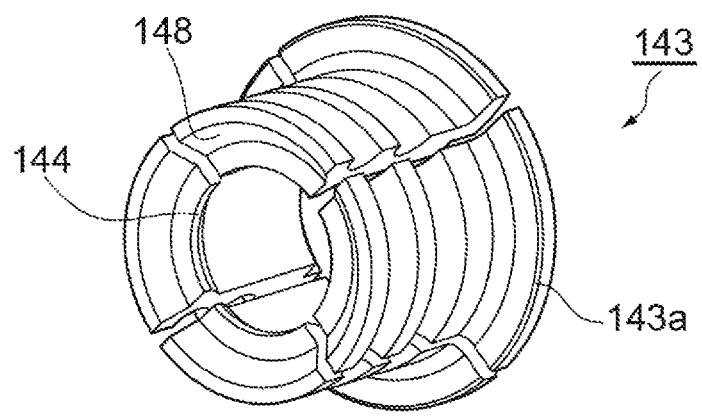
FIG. 7(b) is a perspective view illustrating a tubular member in FIG. 7(a).

As illustrated in FIGS. 6, 7(a) and 7(b), the engaging portion 142 engages with the side surface 141b of an engaged portion 141. The engaging portion 142 includes a tubular member 143, a claw 144, and a second biasing member 145. The tubular member 143 has a cylindrical shape, and is provided to surround an outer peripheral surface of the tube 122 of the rod member 120. The tube 122 is coaxially inserted into the tubular member 143. The tubular member 143 is split into at least two (herein, into quarters) when viewed from the X direction. The tubular member 143 has a flange 143a on its end on the X-direction outside. This flange 143a is pressed in the X direction against the block 111 to be restrained by a coupling member 146. With this configuration, the split tubular member 143 is fixed to the block 111 in a cantilevered manner. The claw 144 is formed on an inner peripheral surface of the tubular member 143. The claw 144 is an annular protrusion formed on an end of the inner peripheral surface of the tubular member 143 on the X-direction inside. The claw 144 protrudes from the inner peripheral surface of the tubular member 143 in a saw-like shape. The claw 144 protrudes from the inner peripheral surface of the tubular member 143 in the shape of a tooth. A side surface 144a of the claw 144 on the X-direction inside is orthogonal to the X direction. A side surface 144b of the claw 144 on the X-direction outside is inclined with respect to the X direction. The side surface 144a of the claw 144 comes into contact with the side surface 141b of an engaged portion 141. The claw 144 corresponds to a tooth of the ratchet on the other side. On an end of an inner peripheral surface of the tubular member 143 on the X-direction inside with respect to the claw 144, an inclined surface 148 that is inclined to become wider toward the X-direction inside is formed.

The second biasing member 145 is a member configured to bias the tubular member 143 toward the rod member 120 (toward the axial center thereof). The second biasing member 145 has an annular shape the outline of which in cross section is circular. The second biasing member 145 is formed of a rubber, for example. The second biasing member 145 is accommodated in each of a plurality of (herein, two) annular recesses formed on an outer peripheral surface of the tubular member 143. The second biasing member 145 biases the tubular member 143 inward in the radial direction with its elastic force acting to reduce diameter. The engaging portion 142 thus configured has elasticity along a direction of approaching the outer peripheral surface of the tube 122 of the rod member 120. Specifically, the engaging portion 142 has elasticity that bends the claw 144 at its end on the X-direction inside in the radial direction.

The damper 101 of the damping device 100 configured as described above is attached to the stacker crane 7 in the initial state illustrated in FIG. 4. At collision time of the stacker crane 7, the tip piece 123 comes into contact with a collision opponent (the corresponding tip piece 123 of the damping device 100 attached to the other stacker crane 7), whereby the rod member 120 is pressed in toward the X-direction inside.

Figure 8B:
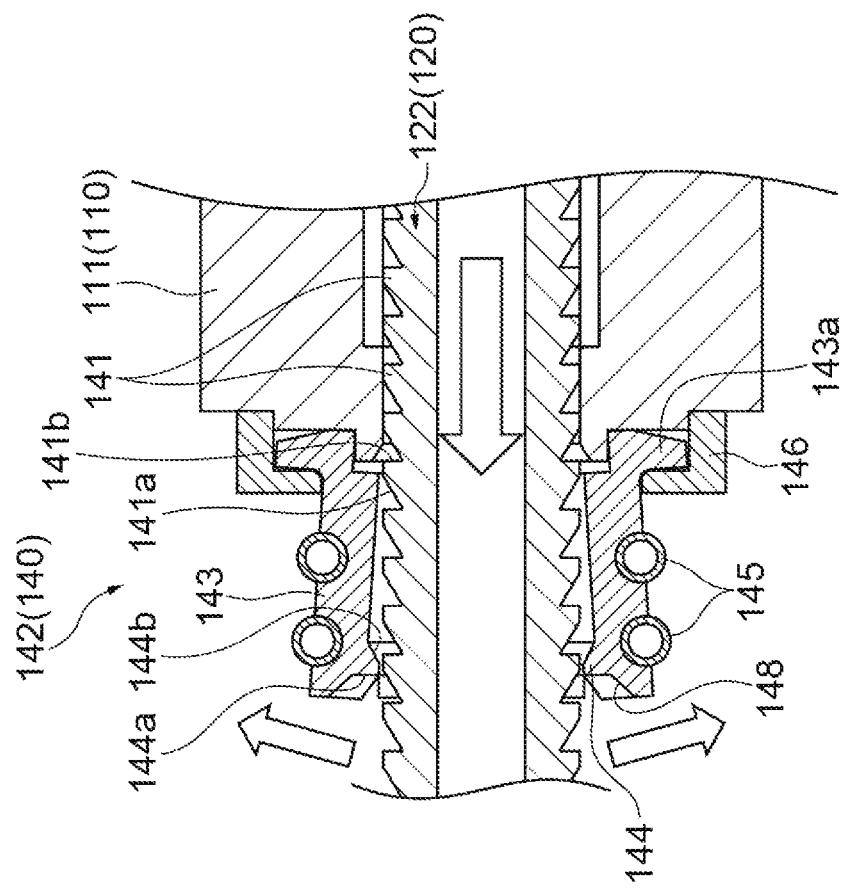
FIG. 8(b) is a sectional view illustrating the engaging portion in FIG. 7(a) at the time of collision.
Figure 8A:
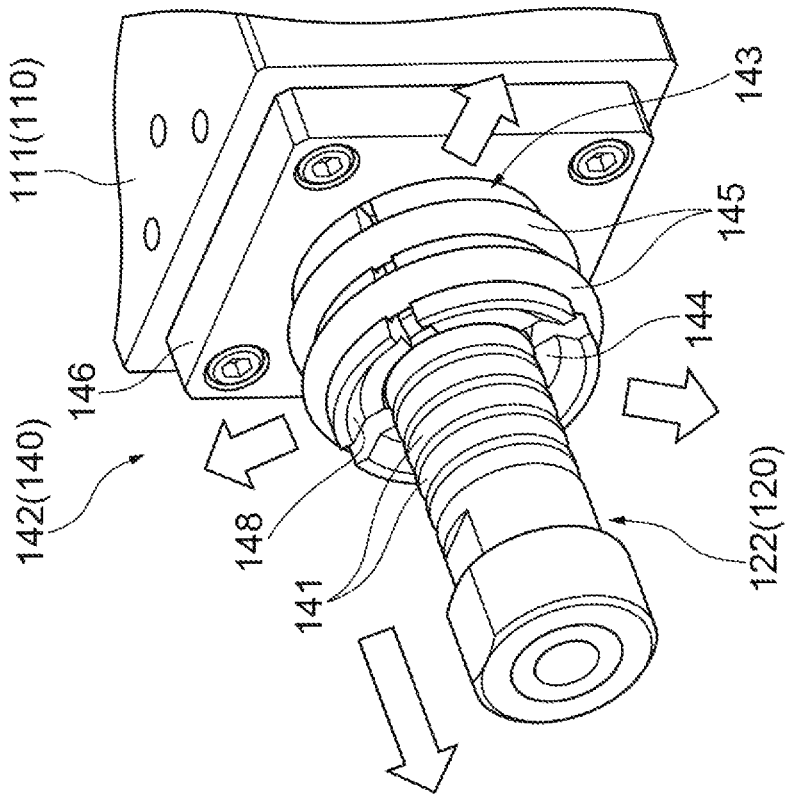
FIG. 8(a) is a perspective view illustrating the engaging portion in FIG. 7(a) at time of collision.

When the rod member 120 has been pressed in toward the X-direction inside, as illustrated in FIGS. 8(a) and 8(b), the side surface 144b as an inclined surface of the claw 144 of the tubular member 143 comes into contact with a side surface 141a as an inclined surface of an engaged portion 141 of the tube 122. The tubular member 143 deforms (the engaging portion 142 elastically deforms) such that the claw 144 overrides the engaged portion 141 and descends. While repeating such deformation at a plurality of the engaged portions 141, the rod member 120 moves toward the X-direction inside (the claw 144 moves along the tube 122 while the claw 144 is continuously in contact with the tube 122). In other words, movement of the rod member 120 toward the X-direction inside is allowed. At this time, because the rod member 120 is biased by the first biasing member 130 toward the X-direction outside, the rod member 120 moves toward the X-direction inside while absorbing impact force of the collision.

Figure 10:
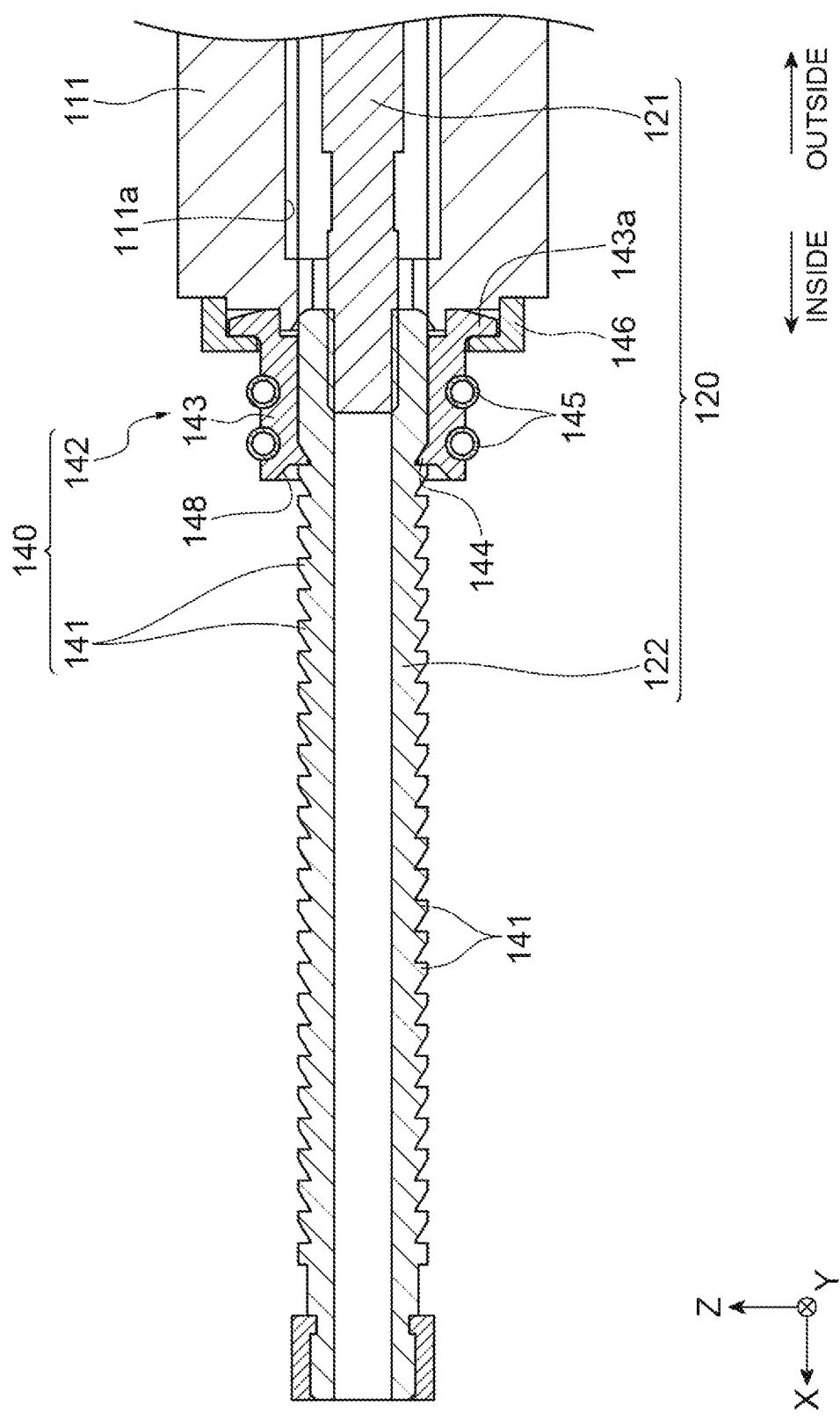
FIG. 10 is a sectional view taken along line X-X in FIG. 9.

As illustrated in FIGS. 9 and 10, when the impact force of the collision has been completely absorbed, the rod member 120 that has moved toward the X-direction inside tends to return to the X-direction outside because it is biased by the first biasing member 130. However, the side surface 144a as a vertical surface of the claw 144 engages with a side surface 141b as a vertical surface of an engaged portion 141, and thus the rod member 120 stops at that position without moving toward the X-direction outside.

The following describes when the damper 101 of the damping device 100 after collision illustrated in FIG. 9 is returned to the initial state illustrated in FIG. 4 by using a damping device jig.

Figure 11:
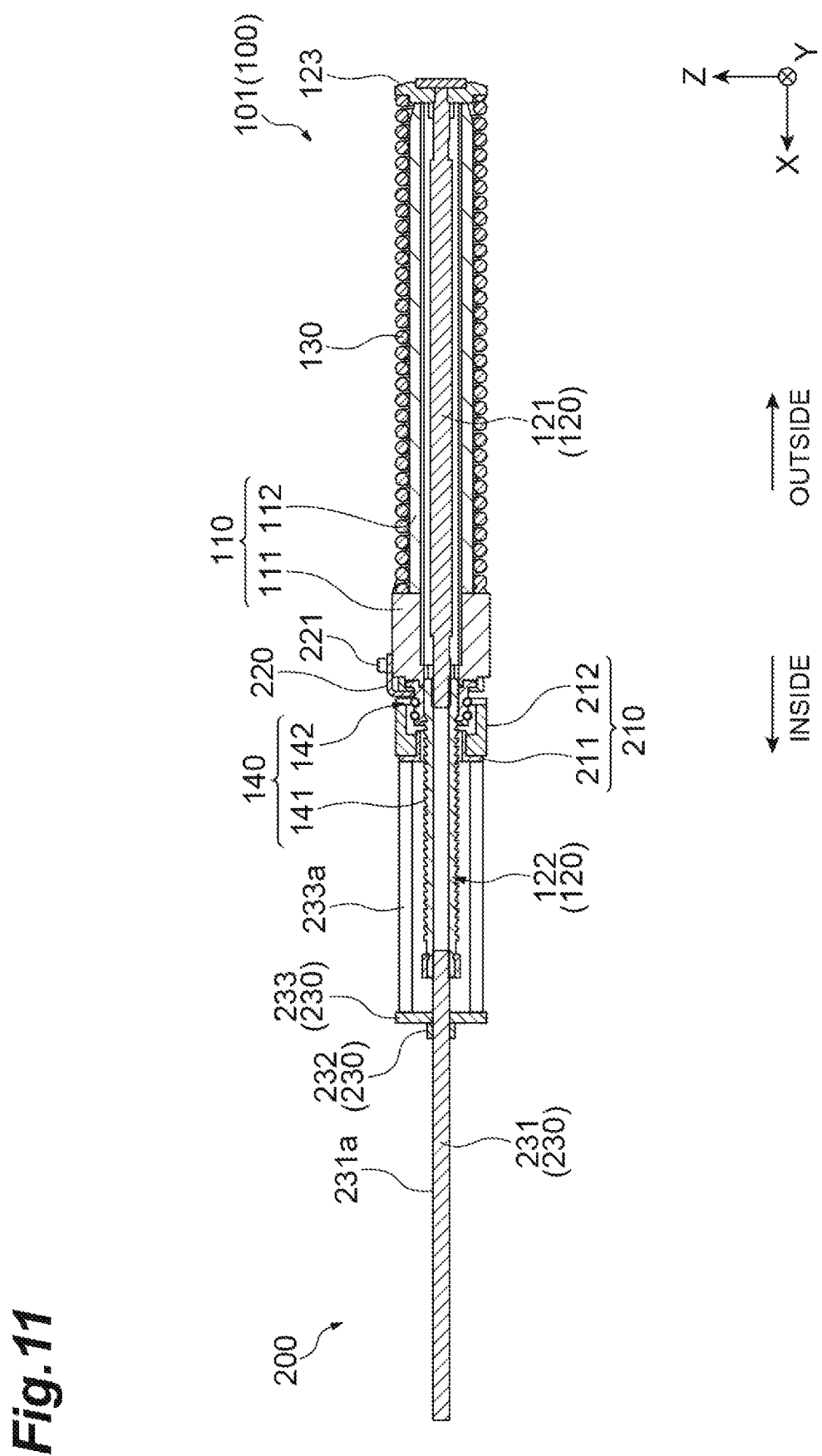
FIG. 11 is a sectional view of the damper in FIG. 9 when returned to an initial state by using a damping device jig.
Figure 12:
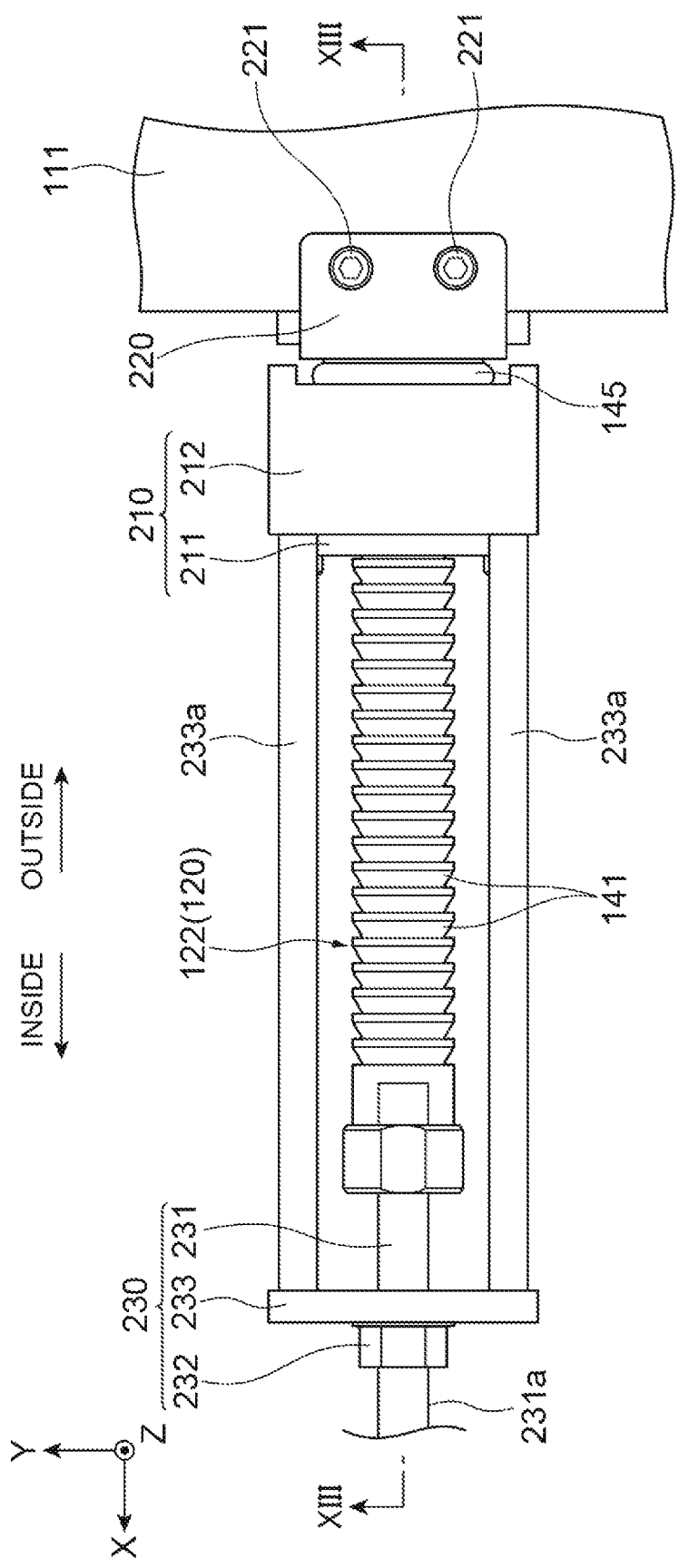
FIG. 12 is a plan view illustrating the damper and the damping device jig in FIG. 11 in an enlarged manner.
Figure 13:
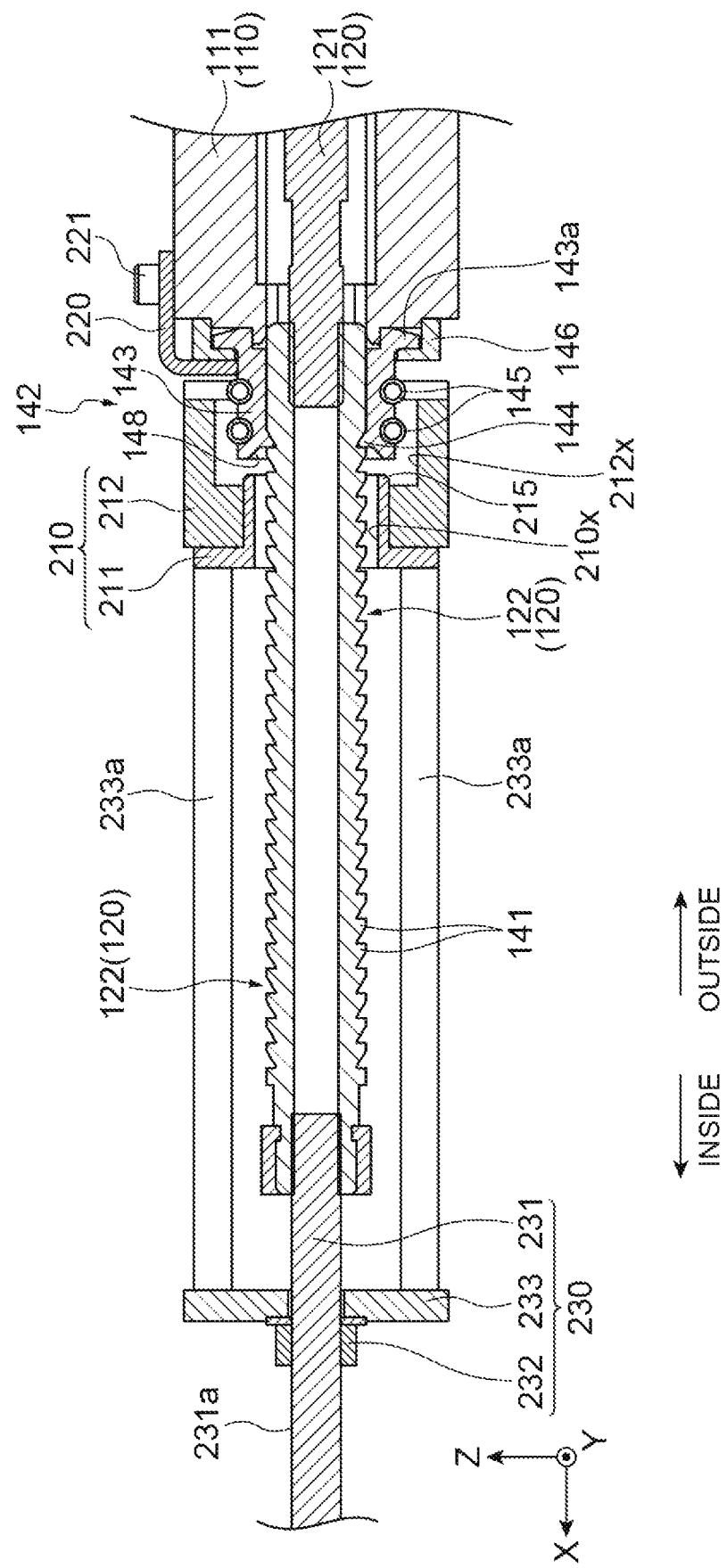
FIG. 13 is a sectional view taken along line XIII-XIII in FIG. 12.

A damping device jig will be described first. As illustrated in FIGS. 11, 12 and 13, a damping device jig 200 is a jig for releasing engagement of the engaging portion 142 with an engaged portion 141 to return the position of the rod member 120 to the initial position. The damping device jig 200 includes a jig body 210, a safety cover (elastic-deformation restriction member) 220, and an adjuster 230.

In the jig body 210, a hole 210x through which the rod member 120 can be inserted is formed. The jig body 210 includes a first member 211 having a contact portion 215 and a second member 212 to which the first member 211 is detachably fixed.

The first member 211 has a cylindrical shape having a flange on its end on the X-direction inside. An end of the first member 211 on the X-direction outside forms the contact portion 215. The contact portion 215 is a portion that is brought into contact with the engaging portion 142 such that the engaging portion 142 elastically deforms in a direction of being separated from the rod member 120. The contact portion 215 comes into contact with the inclined surface 148 of the tubular member 143 of the engaging portion 142 and presses the inclined surface 148 toward the X-direction outside, thereby deforming the tubular member 143 on the X-direction inside in an expanded manner. Specifically, the inclined surface 148 is pressed toward the X-direction outside, whereby the inclined surface 148 is moved along the contact portion 215, and the tubular member 143 on the X-direction inside is accordingly expanded about the flange 143a as a fulcrum. By this operation, the engagement of the engaging portion 142 with the engaged portion 141 is released. The contact portion 215 serves as a "puller wedge."

Figure 16:
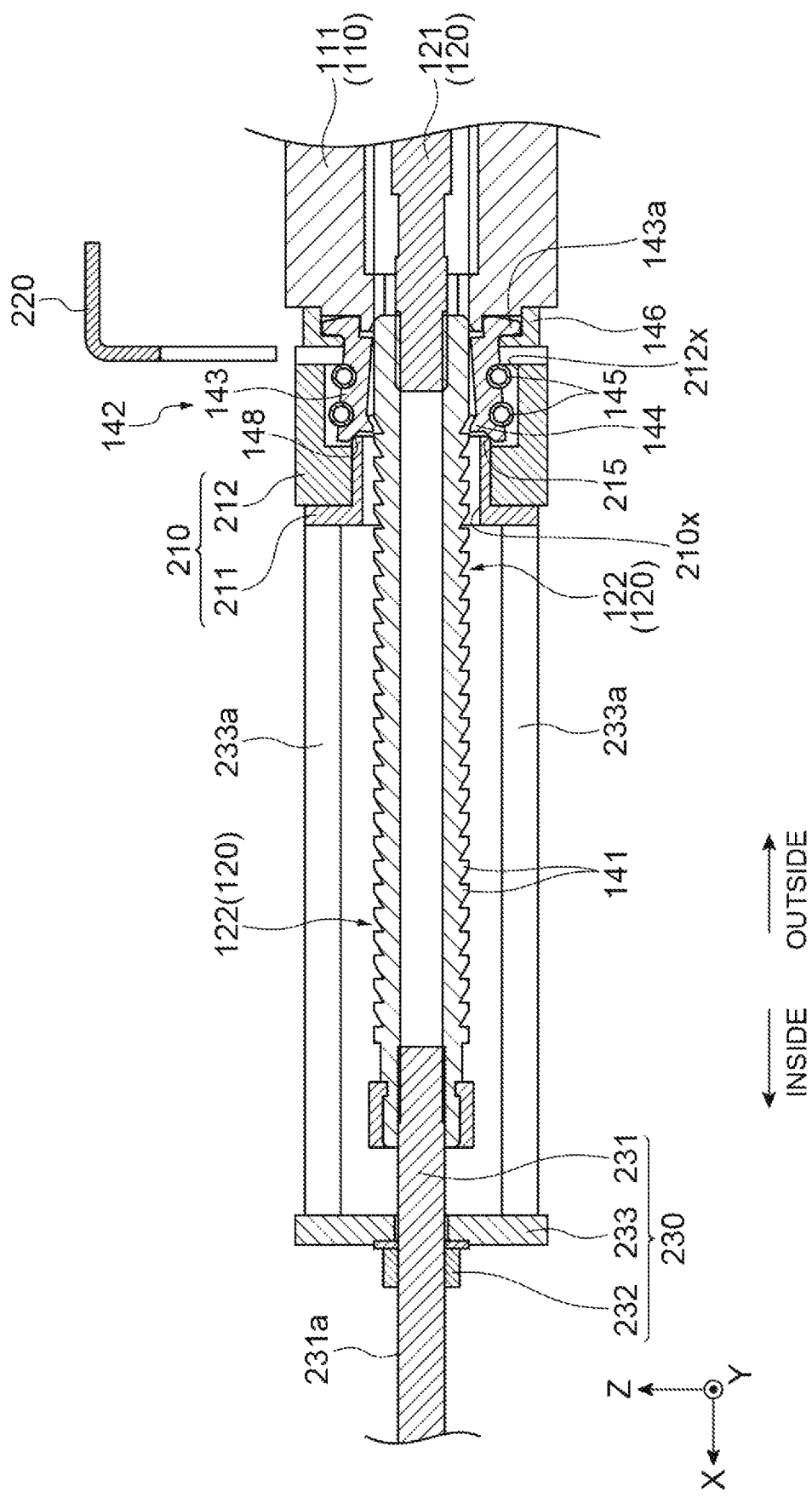
FIG. 16 is a sectional view taken along line XVI-XVI in FIG. 15.
Figure 22:
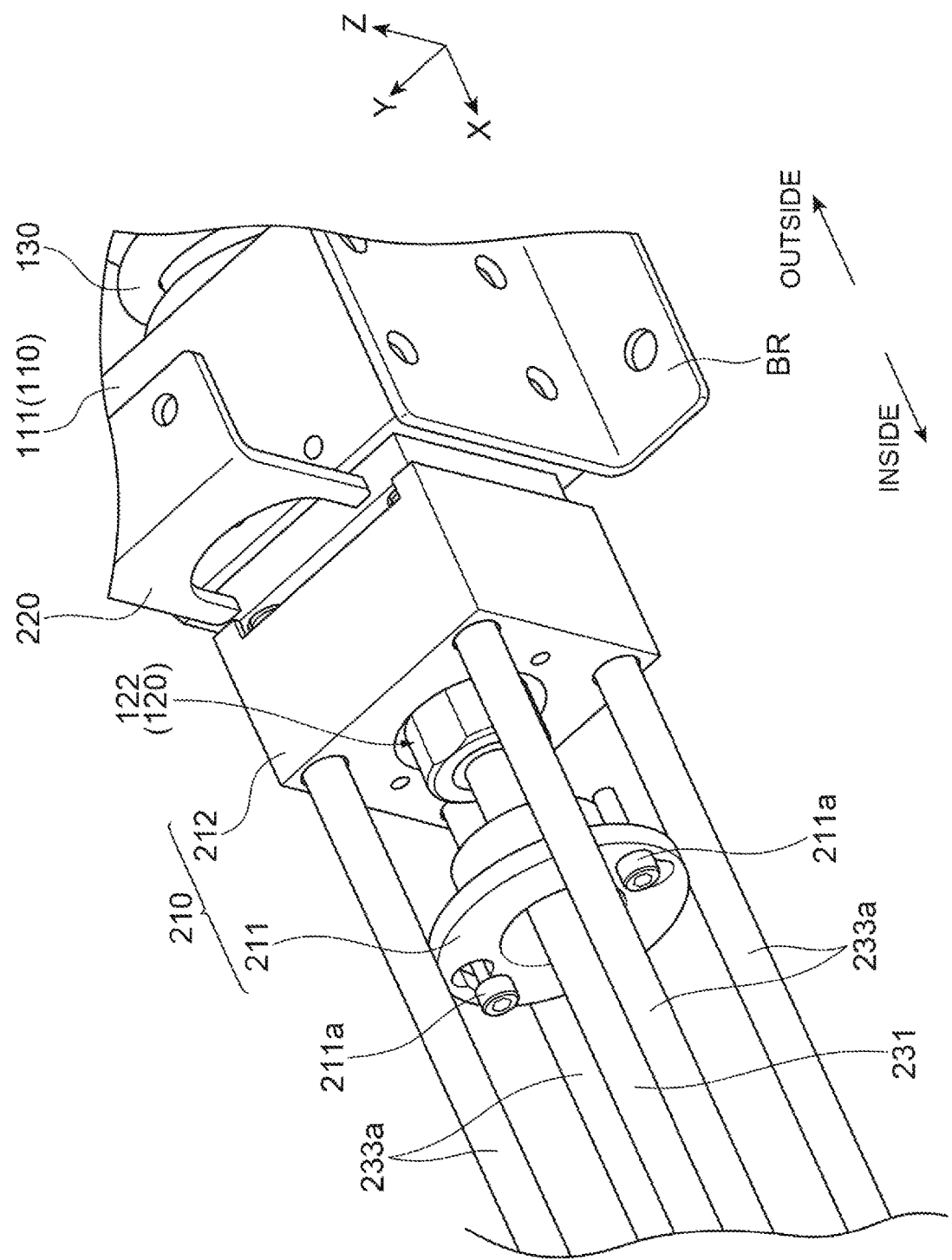
FIG. 22 is a perspective view illustrating the damper in FIG. 20 in an enlarged manner.

The outline of the second member 212 has a rectangular parallelepiped shape. In the second member 212, a recess 212x that is open to the X-direction outside is formed, and the engaging portion 142 is accommodated in this recess 212x. A through hole is formed in a bottom surface of the recess 212x. The first member 211 is coaxially inserted into this through hole and the first member 211 and the second member 212 are fastened by screws 211a as shown in FIG. 22, whereby the first member 211 and the second member 212 are integrated. In a state in which the first member 211 and the second member 212 are integrated, the contact portion 215 protrudes into the recess 212x. The dimensional relation and the positional relation of the contact portion 215 are relations as shown in FIG. 16 in which the contact portion 215 is brought into contact with the inclined surface 148 of the tubular member 143 while a surface of the jig body 210 on the X-direction outside is in contact with the block 111.

The safety cover 220 has a plate-like shape that is bent in an L-shape. A base-end side of the safety cover 220 is detachably fixed to the block 111 by screws 221. A distal-end side of the safety cover 220 contacts an outer peripheral surface of the tubular member 143 of the engaging portion 142 (a side opposite to the rod member 120 side). With this configuration, the tubular member 143 is prevented from deforming unintentionally, and the engagement between the engaging portion 142 and the engaged portion 141 is prevented from being released unintentionally.

The adjuster 230 is detachably fixed to the rod member 120. After the engagement of the engaging portion 142 with the engaged portion 141 has been released, the adjuster 230 adjusts the amount of movement when the rod member 120 is moved toward the X-direction outside by the first biasing member 130. The adjuster 230 includes a shaft 231, a thread-engaging member 232, and a support member 233.

The shaft 231 has a columnar shape extending along the X direction. An end of the shaft 231 on the X-direction outside is inserted into the tube 122, and is detachably fixed to the tube 122 by a screw, for example. On the outer peripheral surface of the shaft 231, an external thread 231a is formed. The thread-engaging member 232 is formed by a nut. On the inner peripheral surface of the thread-engaging member 232, an internal thread configured to thread-engage with the external thread 231a of the shaft 231 is formed. The support member 233 has a plate-like shape. The support member 233 is a member having a surface perpendicular to the X direction. In the support member 233, a through hole 233x through which the shaft 231 is inserted is formed. The support member 233 is in contact with the thread-engaging member 232 on the X-direction outside. The support member 233 is fixed to the second member 212 of the jig body 210 at its four corners with columnar struts 233a interposed therebetween.

When the damping device jig 200 thus configured is used to release the engagement of the engaging portion 142 with the engaged portion 141 and return the position of the rod member 120 to the initial position, the safety cover 220 is attached to the block 111 by the screws 221 first. By this operation, the engagement between the engaging portion 142 and the engaged portion 141 is set in a state of not being released. In this state, the damper 101 is removed from the stacker crane 7. The tube 122 of the rod member 120 is inserted into the hole 210x of the jig body 210, and also the end of the shaft 231 on the X-direction outside is fixed to the tube 122 of the rod member 120. By inserting the tube 122 of the rod member 120 into the hole 210x and fixing the end of the shaft 231 to the tube 122, the position of the contact portion 215 with respect to the inclined surface 148 is determined.

Figure 14:
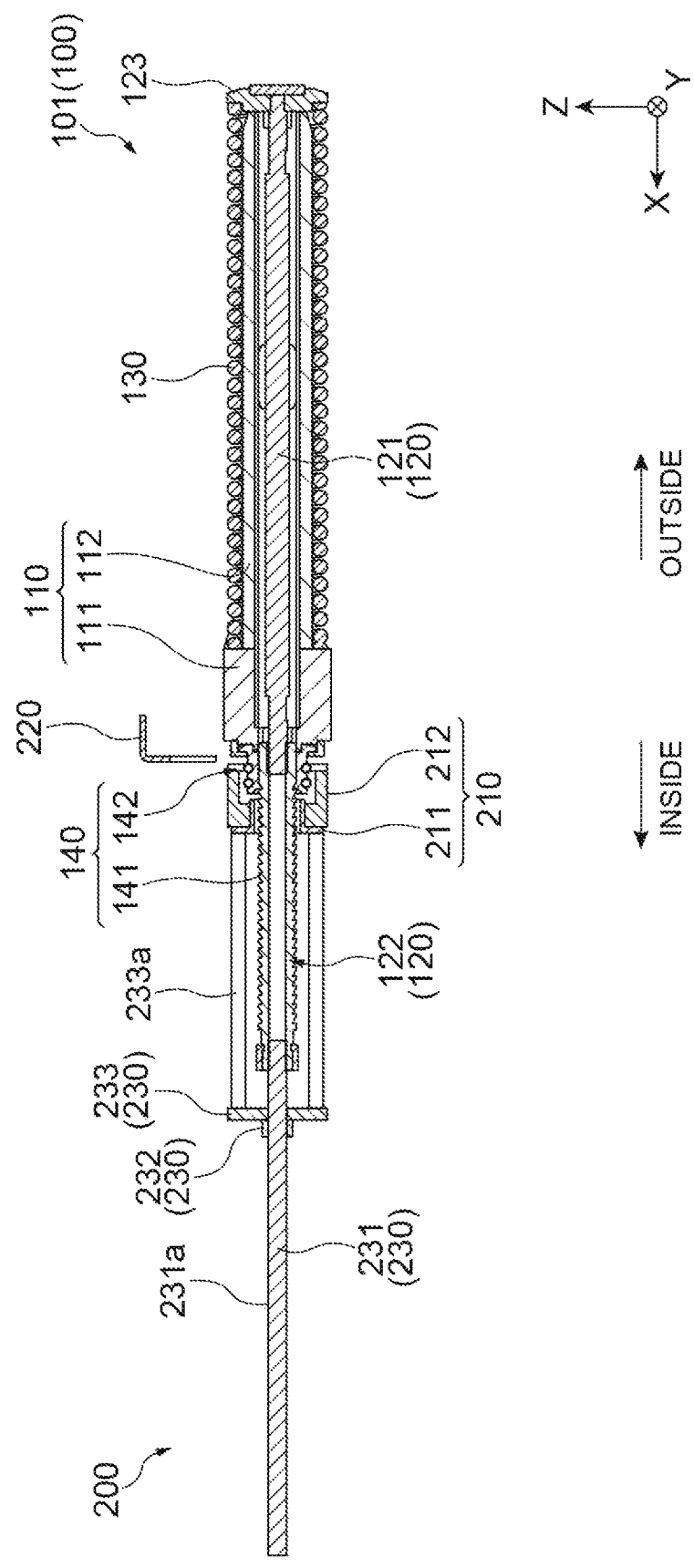
FIG. 14 is a sectional view illustrating a follow-up to FIG. 11 in an enlarged manner.
Figure 15:
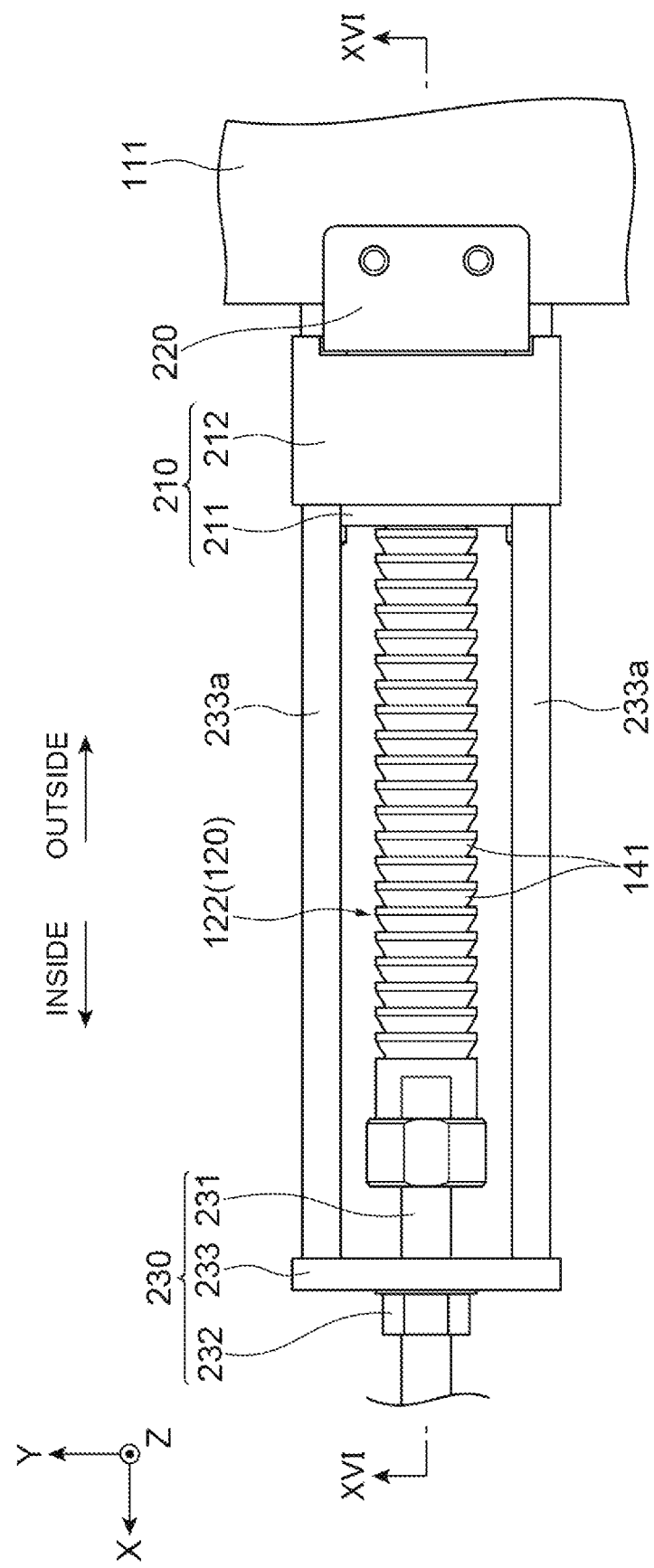
FIG. 15 is a plan view illustrating a follow-up to FIG. 14 in an enlarged manner.

Subsequently, as illustrated in FIG. 14, the screws 221 are unfastened and the safety cover 220 is removed. The shaft 231 is rotated in the one direction as illustrated in FIGS. 15 and 16. By this operation, a thread engagement effect between the external thread 231a of the shaft 231 and the thread-engaging member 232 is exerted, and thus the shaft 231 tends to move toward the X-direction inside. However, because the rod member 120 to be fixed to the shaft 231 is biased toward the X-direction outside by the first biasing member 130, the shaft 231 does not move and a fastening force toward the X-direction outside is applied to the thread-engaging member 232. Consequently, the support member 233 moves toward the X-direction outside, the jig body 210 fixed to the support member 233 with the struts 233a interposed therebetween accordingly moves toward the X-direction outside, and the jig body 210 comes into contact with the block 111.

Figure 17:
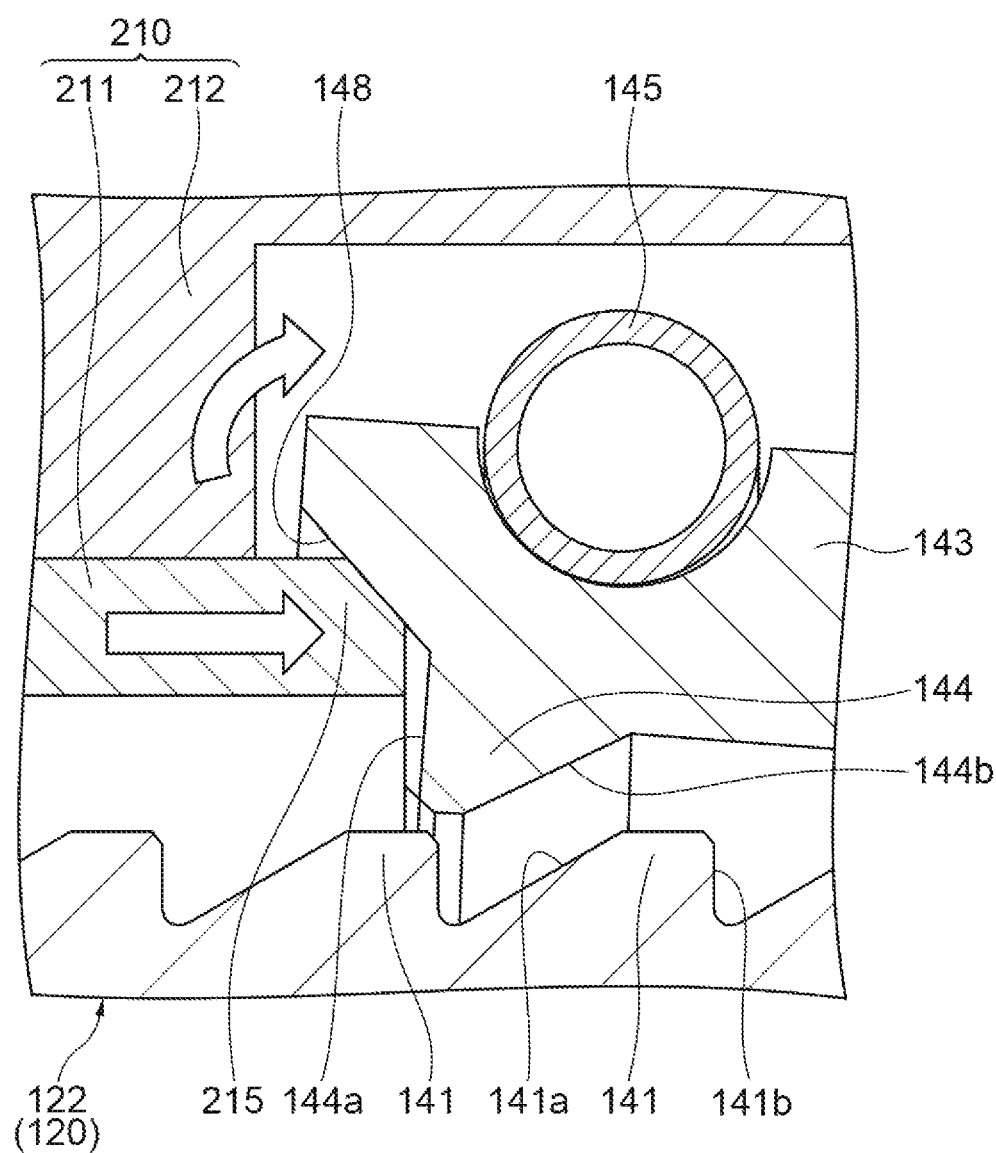
FIG. 17 is a sectional view illustrating the damper in FIG. 16 in an enlarged manner.

At this time, as illustrated in FIG. 17, the contact portion 215 is brought into contact with the inclined surface 148, whereby the inclined surface 148 is pressed toward the X-direction outside. The tubular member 143 on the X-direction inside deforms to be opened, and the claw 144 is separated from the engaged portion 141, whereby the engagement between the claw 144 and the engaged portion 141 is released. When the engagement between the claw 144 and the engaged portion 141 has been released, the rod member 120 tends to return to the X-direction outside because the rod member 120 is biased toward the X-direction outside by the first biasing member 130. However, because the rod member 120 is fixed to the shaft 231 and also the thread-engaging member 232 with which this shaft 231 thread-engages is supported by the support member 233, the rod member 120 stays at the position without moving.

Figure 18:
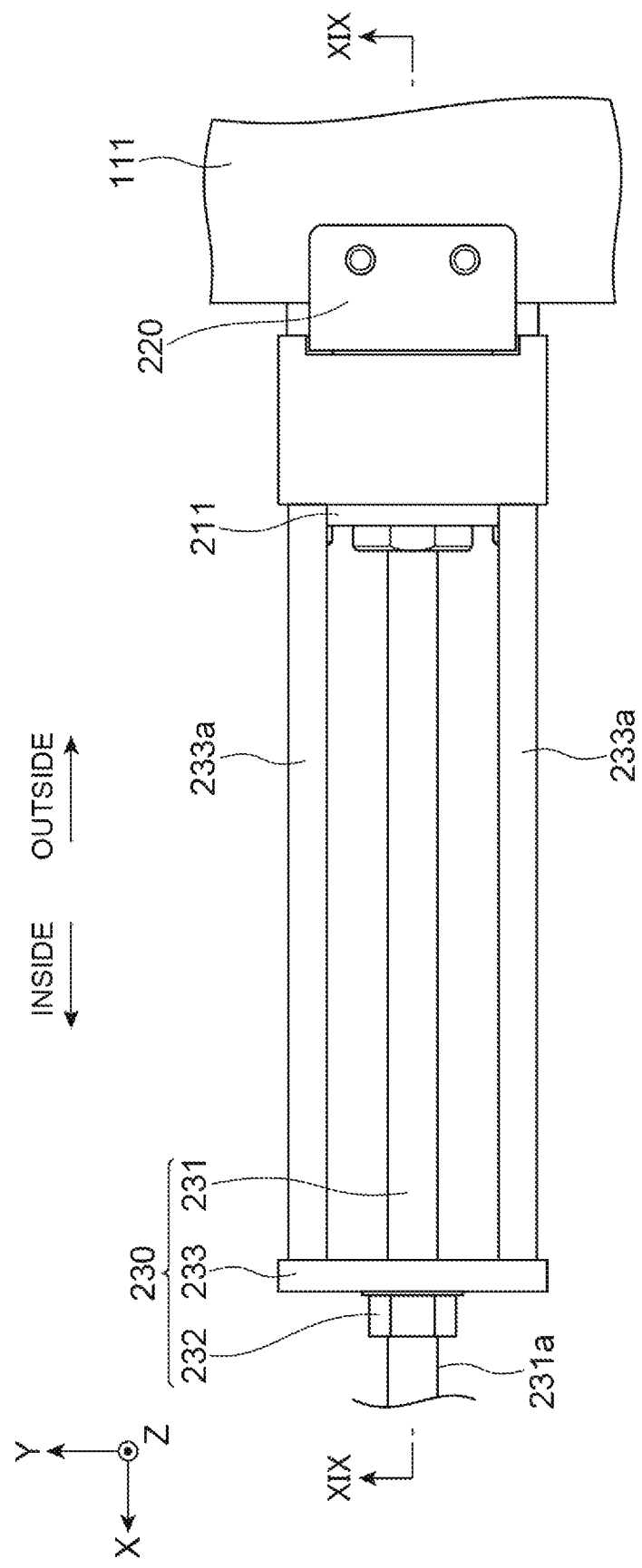
FIG. 18 is a plan view illustrating a follow-up to FIG. 16 in an enlarged manner.
Figure 19:
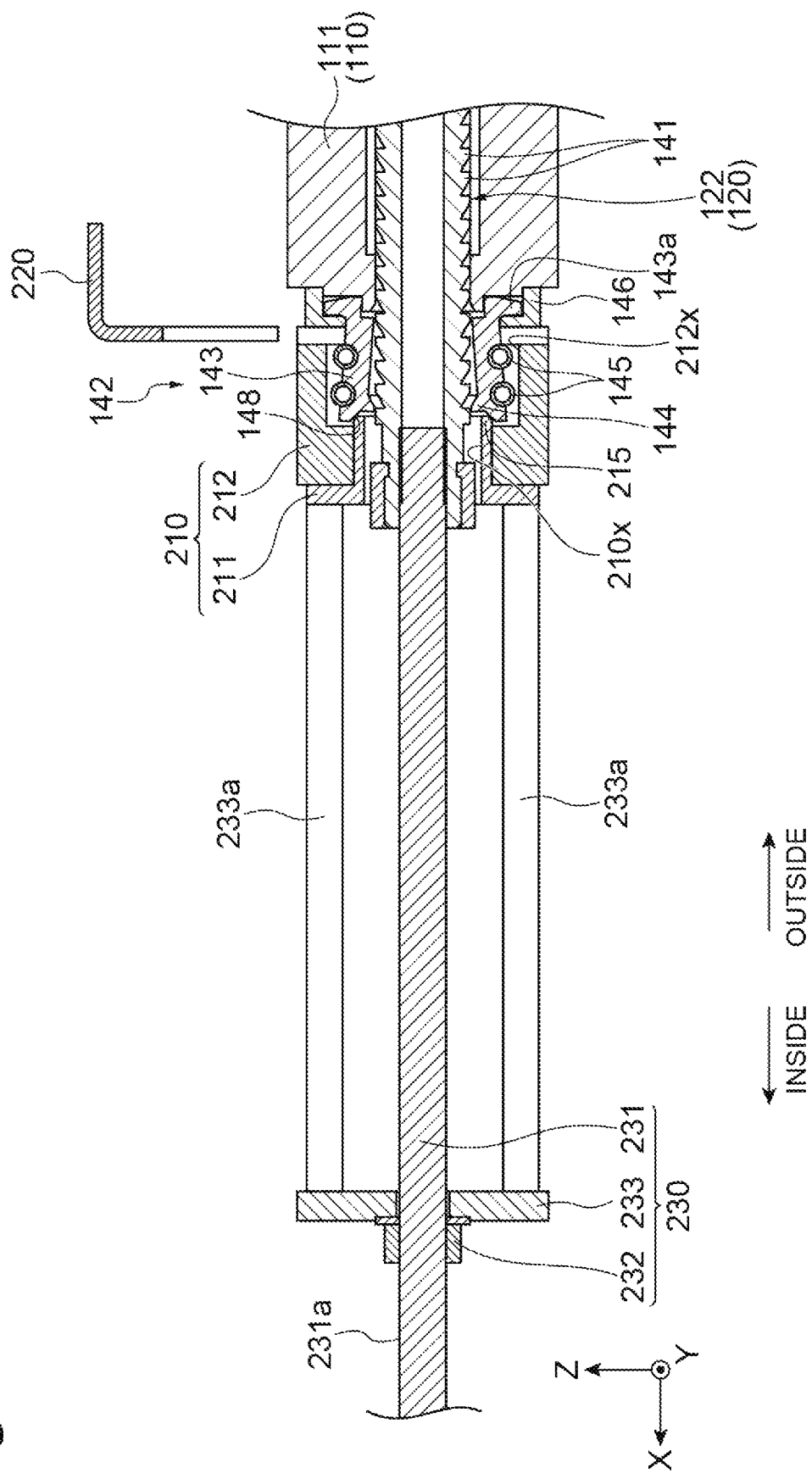
FIG. 19 is a sectional view taken along line XIX-XIX in FIG. 18.

Subsequently, as illustrated in FIGS. 18 and 19, the shaft 231 is rotated in the other direction. By this operation, the thread engagement effect between the external thread 231a of the shaft 231 and the thread-engaging member 232 is exerted, and thus the shaft 231 moves toward the X-direction outside and also the rod member 120 fixed to the shaft 231 moves toward the X-direction outside while being biased by the first biasing member 130. The rod member 120 is returned to the initial position by continuously rotating the shaft 231 in the other direction.

Figure 20:
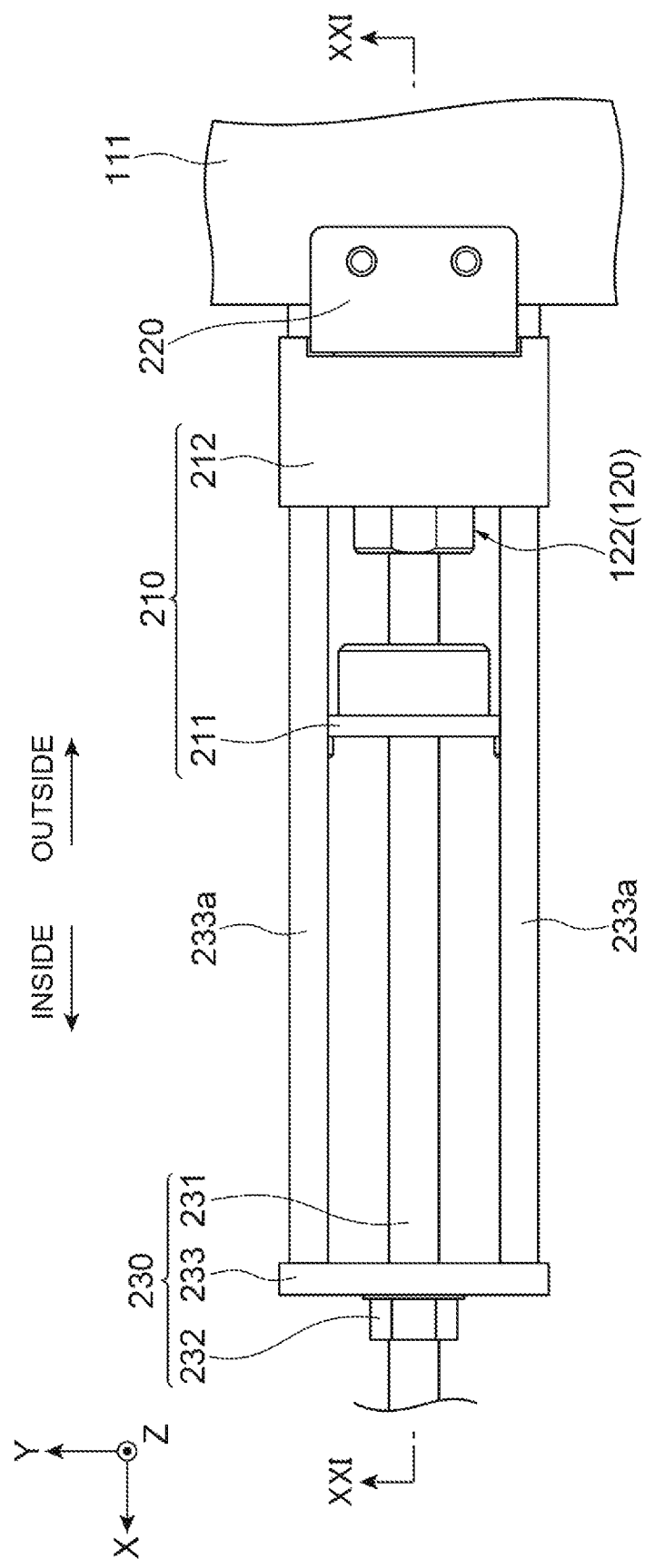
FIG. 20 is a plan view illustrating a follow-up to FIG. 18 in an enlarged manner.
Figure 21:
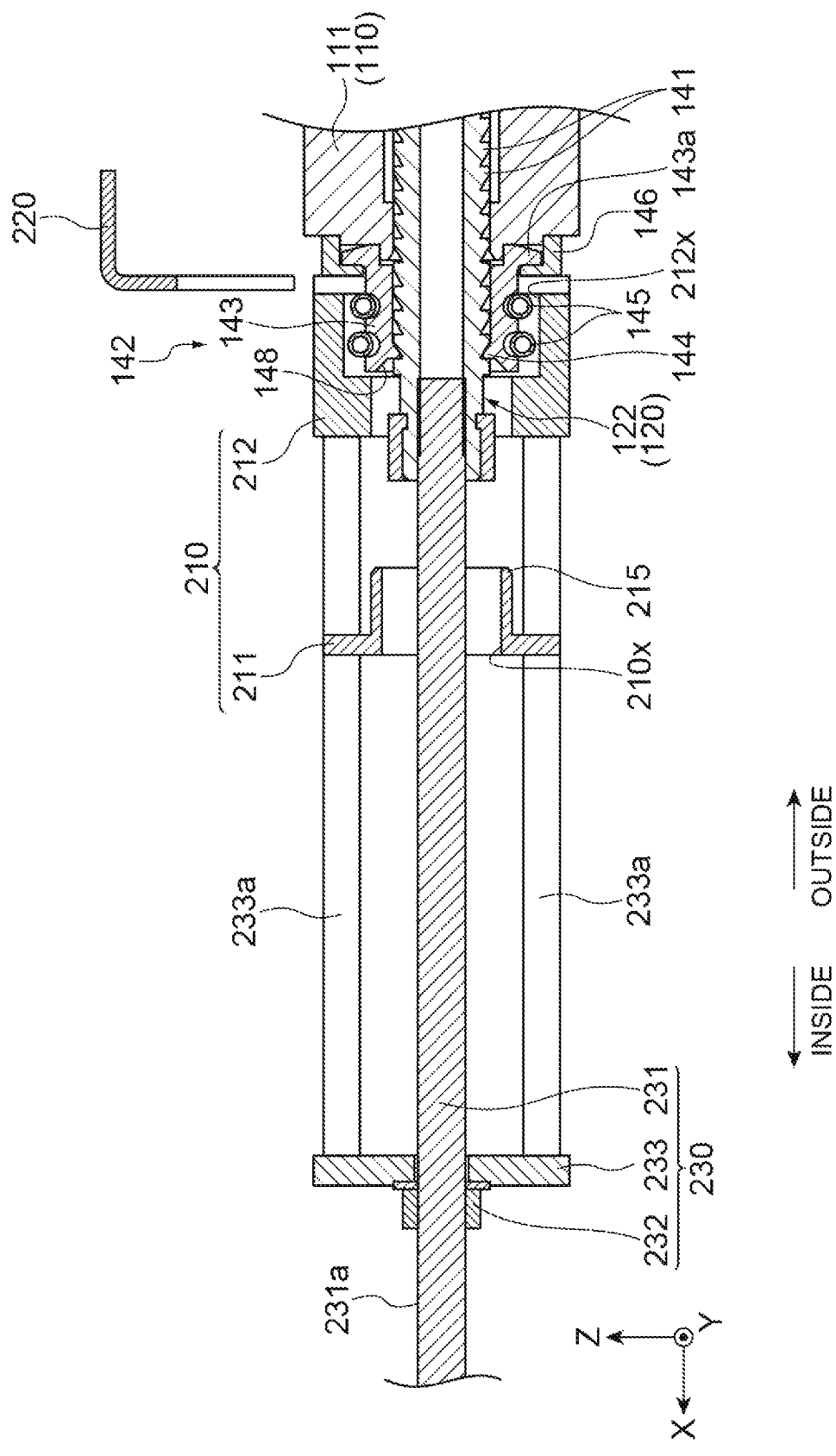
FIG. 21 is a sectional view taken along line XXI-XXI in FIG. 20.

Finally, as illustrated in FIGS. 20, 21 and 22, the screws 211a are unfastened and the first member 211 is removed from the second member 212 toward the X-direction inside. By this operation, the contact portion 215 is separated from the tubular member 143, the tubular member 143 that has deformed returns as before, and the claw 144 of the engaging portion 142 engages with an engaged portion 141 again. By the above-described operations, the damper 101 returns to the initial state as illustrated in FIGS. 4 and 5.

As described above, in the damping device 100, when the stacker crane 7 has collided, the rod member 120 contacts a collision opponent, thereby being pressed in toward the X-direction inside. Because the rod member 120 is biased toward the X-direction outside by the first biasing member 130, the rod member 120 moves toward the X-direction inside while absorbing impact force of the collision. The rod member 120 that has moved toward the X-direction inside is prevented from returning (moving) toward the X-direction outside to its initial position by restriction of the lock mechanism 140. Thus, the stacker crane 7 is prevented from being pushed back due to returning of the rod member 120. Thus, with the damping device 100, when the stacker crane 7 has collided, the impact force thereof can be alleviated, and also the stacker crane 7 can be prevented from being pushed back. Consequently, the possibility of breakage of equipment can be reduced. The damping device 100 reduces the reaction at the collision time, increases flexibility at low cost, and prevents spring back.

In the damping device 100, the lock mechanism 140 includes a plurality of the engaged portions 141 and the engaging portion 142. The engaged portions 141 are aligned along the X direction, each of which is a protrusion formed on the outer peripheral surface of the rod member 120, each side surface 141a thereof on the X-direction inside is inclined with respect to the X direction, and each side surface 141b thereof on the X-direction outside is orthogonal to the X direction. The engaging portion 142 has elasticity along a direction of approaching the outer peripheral surface of the rod member 120, and engages with the side surface 141b of each engaged portion 141 on the X-direction outside. With this configuration, the above-described effects of alleviating the impact force and also preventing the stacker crane 7 from being pushed back when the stacker crane 7 has collided can be effectively obtained.

In the damping device 100, the engaging portion 142 includes the tubular member 143, the claw 144, and the second biasing member 145. The tubular member 143 is provided to surround the outer peripheral surface of the rod member 120, and is split into at least two when viewed from the X direction. The claw 144 is formed on an inner peripheral surface of the tubular member 143, and contacts an engaged portion 141. The second biasing member 145 biases the tubular member 143 toward the rod member 120. With this configuration, it is possible to reliably engage the engaging portion 142 with the engaged portion 141 while facilitating attachment of the engaging portion 142.

In the damping device 100, an inner peripheral surface of the tubular member 143 on the X-direction inside has the inclined surface 148 that is inclined to become wider toward the X-direction inside. In this configuration, by pressing the damping device jig 200 against the inclined surface 148 along the X direction, the tubular member 143 can be deformed to be opened, whereby the engagement of the engaging portion 142 with the engaged portion 141 can be released.

In the stacker crane 7, the above-described effects can be obtained because it includes the damping device 100. Furthermore, because the damper 101 is provided at least two, impact force of collision can be distributed to be alleviated when the stacker crane 7 has collided. A moment generated in the stacker crane 7 due to the impact force can also be alleviated.

The stacker crane 7 includes, as the damper 101, the first damper 101A, the second damper 101B, the third damper 101C, and the fourth damper 101D on one and the other sides in each of the vertical direction and the width direction.

With this configuration, the first to fourth dampers 101A to 101D cooperatively operate, thereby being able to further distribute impact force of collision when the stacker crane 7 has collided. The moment generated in the stacker crane 7 due to this impact force can also be further alleviated. The rigidity of the stacker crane (a mast in particular) 7 can be effectively reduced, whereby the configuration of the stacker crane can be simplified.

In the transport system 1, the dampers 101 are provided to the first stacker crane 7A on a side closer to the second stacker crane 7B and the second stacker crane 7B on a side closer to the first stacker crane 7A. The damper 101 of the first stacker crane 7A and the damper 101 of the second stacker crane 7B are provided at positions where they can come into contact with each other. Thus, when the first stacker crane 7A and the second stacker crane 7B have collided with each other, the damper 101 of the first stacker crane 7A and the damper 101 of the second stacker crane 7B come into contact with each other, thereby being able to alleviate the impact force.

In the damping device jig 200, only by inserting the rod member 120 through the hole 210x of the jig body 210 and bringing the contact portion 215 of the jig body 210 into contact with the engaging portion 142 to press it thereagainst, the engaging portion 142 can be elastically deformed in the direction of being separated from the rod member 120. Thus, the engaging portion 142 can be separated from the side surface 141b of the engaged portion 141 on the X-direction outside, whereby engagement of the engaging portion 142 with the engaged portion 141 can be released (hereinafter "engagement release"). In other words, with the damping device jig 200, engagement can be easily released in the damping device 100. The damper 101 can be easily returned to the initial state. By using the damping device jig 200, the damping device 100 can be used repeatedly.

The damping device jig 200 includes the safety cover 220. The safety cover 220 is detachably fixed to the damper 101, and also is in contact with the outer peripheral surface of the engaging portion 142 (a side thereof opposite to the rod member 120 side). With this configuration, the engaging portion 142 can be prevented from elastically deforming unintentionally in the direction of being separated from the rod member 120, and the engagement can be prevented from being released unintentionally. The safety cover 220 is in contact with the outer peripheral surface of the engaging portion 142, but may be adjacent to the outer peripheral surface of the engaging portion 142. In this example also, the engaging portion 142 can be prevented from elastically deforming in the direction of being separated from the rod member 120, and the engagement can be prevented from being released unintentionally.

The damping device jig 200 includes the adjuster 230. The adjuster 230 is detachably fixed to the rod member 120, and adjusts the amount of movement when the rod member 120 is biased to be moved toward the X-direction outside by the first biasing member 130 after engagement of the engaging portion 142 with the engaged portion 141 has been released. With this configuration, the rod member 120 can be prevented from returning to the initial position immediately after the engagement has been released.

In the damping device jig 200, the adjuster 230 includes the shaft 231, the thread-engaging member 232, and the support member 233. The shaft 231 extends along the X direction, an end thereof on the X-direction outside is detachably fixed to the rod member 120 on the X-direction inside, and the outer peripheral surface thereof has the external thread 231a. The thread-engaging member 232 thread-engages with the external thread 231a of the shaft 231. The support member 233 is fixed to the jig body 210, and is in contact with the thread-engaging member 232 on the X-direction outside. With this configuration, by rotating the shaft 231 in one direction, the thread-engaging member 232 is tightened toward the X-direction outside, and the jig body 210 is pressed toward the X-direction outside to be moved with the support member 233 interposed therebetween. The jig body 210 of the contact portion 215 is brought into contact with the engaging portion 142, the engaging portion 142 is elastically deformed in the direction of being separated from the rod member 120, the engagement is released, and then this movement of the jig body 210 is stopped. Subsequently, by rotating the shaft 231 in the other direction, the rod member 120 is moved toward the X-direction outside toward the initial position by the amount of movement corresponding to this rotation. Thus, engagement release and control of the amount of movement of the rod member 120 by the adjuster 230 can be performed.

In the damping device jig 200, the jig body 210 includes the first member 211 to which the contact portion 215 is provided and the second member 212 to which the support member 233 is fixed and also the first member 211 is detachably fixed. In this configuration, after the engagement has been released, by removing the first member 211 from the second member 212, the engaging portion 142 can be easily engaged with the engaged portion 141 again.

Because the claw 144 is provided on the inner peripheral surface of the tubular member 143, the claw 144 engages with substantially all circumferential area of the engaged portion 141. Thus, the area of contact between the claw 144 and the engaged portion 141 can be increased. Furthermore, by the holding force (elastic force) of the annular second biasing member 145, the claw 144 and the engaged portion 141 can be tightly locked (engaged) with each other. In this regard, when the flange 143a and the claw 144 are separated more, the movement distance of the claw 144 for releasing the lock mechanism 140 can be reduced more.

Although this example has been described, our devices, cranes, systems and jigs are not limited to the above-described example, and various modifications may be made without departing from the scope of this disclosure.

In the above-described example, the stacker crane for which the damping device 100 is used is not limited to a particular one, and the damping device 100 may be used for a stacker crane having a configuration different from that of the stacker crane 7. The number of stacker cranes 7 included in the transport system 1 is not limited to a particular one, and may be one, or may be three or more.

In the example, the positions where the dampers 101 are mounted on each stacker crane 7 and the number thereof are not limited to particular ones. For example, the dampers 101 may be provided at positions that are symmetry with respect to each other in the stacker crane 7 when viewed from the X direction. In the example, the configuration of the adjuster 230 is not limited to a particular one, and a configuration using at least one of a spring or a viscoelastic body, for example, may be used if the amount of movement when the rod member moves toward the X-direction outside after the engagement has been released can be adjusted.

In the example, the lock mechanism 140 is used as a movement restriction mechanism. However, the configuration of the movement restriction mechanism is not limited to a particular one. Various mechanisms may be used if they are mechanisms configured to allow the rod member 120 to move toward the X-direction inside, and also restrict movement of the rod member 120 toward the X-direction outside when the rod member 120 has moved toward the X-direction inside.

For example, as illustrated in FIG. 23(a), a columnar rod member 320 may be provided instead of the rod member 120 as shown in FIG. 5, and a lock mechanism 340 may be provided instead of the lock mechanism 140 as shown in FIG. 5. The lock mechanism 340 includes steel balls 341 and a cylindrical member 342. On an inner peripheral surface of the cylindrical member 342 on the X-direction inside, an inclined surface 342a that is inclined to become wider toward the X-direction inside is formed. The steel balls 341 are disposed to contact the inclined surface 342a and the outer peripheral surface of the rod member 320. In this lock mechanism 340, movement of the rod member 320 toward the X-direction outside is restricted by friction between the steel balls 341 and the inclined surface 342a and friction between the steel balls 341 and the outer peripheral surface of the rod member 320.

In the example, the inner peripheral surface of the tubular member 143 on the X-direction inside has the inclined surface 148. However, this disclosure is not limited to this configuration. A flange may be formed on an end of tubular member 143 on the X-direction inside without forming the inclined surface 148 of the example, and the engagement of the engaging portion 142 with the engaged portion 141 may be released by pushing the flange with the contact portion 215 toward the X-direction outside.

Alternatively, for example, as illustrated in FIG. 23(b), a columnar rod member 420 may be provided instead of the rod member 120 as shown in FIG. 5, and a lock mechanism 440 may be provided instead of the lock mechanism 140 as shown in FIG. 5. The lock mechanism 340 includes a collar 441 having a truncated cone shape and a cylindrical member 442. On an inner peripheral surface of the cylindrical member 442 on the X-direction inside, an inclined surface 442a that is inclined to become wider toward the X-direction inside is formed. The collar 441 is disposed to contact the inclined surface 442a and the outer peripheral surface of the rod member 420. In this lock mechanism 440, movement of the rod member 420 toward the X-direction outside is restricted by friction between the collar 441 and the inclined surface 442a and friction between the collar 441 and the outer peripheral surface of the rod member 420.

In the example, the damper 101 may be provided singly to an end of each stacker crane 7 on the X-direction outside.

The invention claimed is:

1. A damping device comprising a damper provided to an outer end of a stacker crane in a traveling direction, wherein the damper comprises:
a rod member extending along the traveling direction;
a first biasing member configured to bias the rod member outward in the traveling direction; and
a movement restriction mechanism configured to allow inward movement of the rod member in the traveling direction and restrict outward movement of the rod member in the traveling direction when the rod member has moved inward in the traveling direction;
wherein
the movement restriction mechanism comprises:
a plurality of engaged portions aligned along the traveling direction, the plurality of engaged portions each being a protrusion formed on an outer peripheral surface of the rod member, and each having an inner side surface in the traveling direction inclined with respect to the traveling direction and an outer side surface in the traveling direction orthogonal to the traveling direction; and
an engaging portion having elasticity along a direction of approaching the outer peripheral surface of the rod member and configured to engage with the outer side surface of each engaged portion in the traveling direction;
wherein
the engaging portion comprises:
a tubular member provided to surround the outer peripheral surface of the rod member and split into at least two when viewed from the traveling direction;
a claw formed on an inner peripheral surface of the tubular member and configured to contact the engaged portion; and
a second biasing member configured to bias the tubular member toward the rod member; and
wherein an inner side, in the traveling direction, of an inner peripheral surface of the tubular member has an inclined surface inclined to become wider toward the traveling direction.

2. A stacker crane comprising the damping device according to claim 1, wherein the damper is provided on at least two outer ends of the stacker crane in the traveling direction.

3. The stacker crane according to claim 2, further comprising, as the damper, a first damper, a second damper, a third damper, and a fourth damper, wherein
the first damper is provided on an upper side in a vertical direction and on one side in a width direction intersecting the traveling direction and the vertical direction,
the second damper is provided on the upper side in the vertical direction and on the other side in the width direction,
the third damper is provided on a lower side in the vertical direction and on the one side in the width direction, and
the fourth damper is provided on the lower side in the vertical direction and on the other side in the width direction.

4. A stacker crane comprising:
a damping device comprising a damper provided to an outer end of the stacker crane in a traveling direction, wherein
the damper comprises:
a rod member extending along the traveling direction;
a first biasing member configured to bias the rod member outward in the traveling direction; and
a movement restriction mechanism configured to allow inward movement of the rod member in the traveling direction and restrict outward movement of the rod member in the traveling direction when the rod member has moved inward in the traveling direction;
wherein the damper is provided on at least two outer ends of the stacker crane in the traveling direction; and
a first stacker crane and a second stacker crane, wherein
the first stacker crane includes the damper on its outer end in the traveling direction on a side closer to the second stacker crane,
the second stacker crane includes the damper on its outer end in the traveling direction on a side closer to the first stacker crane, and
the damper of the first stacker crane and the damper of the second stacker crane are disposed at positions such that the dampers are adapted to contact each other.

5. A damping device jig for use with a damping device comprising a damper provided to an outer end of a stacker crane in a traveling direction, wherein the damper comprises:
- a rod member extending along the traveling direction;
- a first biasing member configured to bias the rod member outward in the traveling direction; and
- a movement restriction mechanism configured to allow inward movement of the rod member in the traveling direction and restrict outward movement of the rod member in the traveling direction when the rod member has moved inward in the traveling direction;

wherein
the movement restriction mechanism comprises:
- a plurality of engaged portions aligned along the traveling direction, the plurality of engaged portions each being a protrusion formed on an outer peripheral surface of the rod member, and each having an inner side surface in the traveling direction inclined with respect to the traveling direction and an outer side surface in the traveling direction orthogonal to the traveling direction; and
- an engaging portion having elasticity along a direction of approaching the outer peripheral surface of the rod member and configured to engage with the outer side surface of each engaged portion in the traveling direction; and configured to release engagement of the engaging portion with the engaged portion, the damping device jig comprising a jig body in which a hole, through which the rod member is insertable, is formed, wherein the jig body has a contact portion configured to contact the engaging portion such that the engaging portion elastically deforms in a direction of being separated from the rod member.

6. The damping device jig according to claim 5, further comprising an elastic-deformation restriction member detachably fixed to the damper and configured to contact or be adjacent to a side of the engaging portion opposite to a rod member side.

7. The damping device jig according to claim 5, further comprising an adjuster detachably fixed to the rod member and configured to adjust the amount of movement when the rod member is biased to be moved outward in the traveling direction by the first biasing member after engagement of the engaging portion with the engaged portion has been released.

8. The damping device jig according to claim 7, wherein the adjuster comprises:
- a shaft extending along the traveling direction, having one end detachably fixed to an inside on the rod member in the traveling direction, and having an external thread on its outer peripheral surface;
- a thread-engaging member thread-engaging with the external thread of the shaft; and
- a support member fixed to the jig body and being in contact with an outside on the thread-engaging member in the traveling direction.

9. The damping device jig according to claim 8, further comprising a first member to which the contact portion is provided and a second member to which the support member is fixed and also the first member is detachably fixed.

* * * * *